United States Patent
Amada

(10) Patent No.: US 8,492,176 B2
(45) Date of Patent: Jul. 23, 2013

(54) METHOD OF MANUFACTURING SEMICONDUCTOR DEVICE

(75) Inventor: Haruo Amada, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 0 days.

(21) Appl. No.: 13/609,953

(22) Filed: Sep. 11, 2012

(65) Prior Publication Data
US 2013/0089970 A1 Apr. 11, 2013

(30) Foreign Application Priority Data
Oct. 11, 2011 (JP) ................. 2011-223665

(51) Int. Cl.
*H01L 21/66* (2006.01)
(52) U.S. Cl.
USPC ............ 438/15; 438/459; 156/64; 156/154; 156/285; 257/E21.531; 257/E21.606
(58) Field of Classification Search
USPC ............ 438/15, 459, 977; 156/64, 154, 285
See application file for complete search history.

(56) References Cited

U.S. PATENT DOCUMENTS

| | | | |
|---|---|---|---|
| 6,080,263 A | 6/2000 | Saito et al. | |
| 6,258,198 B1 | 7/2001 | Saito et al. | |
| 7,442,363 B2 | 10/2008 | Takahashi et al. | |
| 2003/0060021 A1* | 3/2003 | Kurosawa et al. | 438/455 |
| 2005/0019980 A1* | 1/2005 | Kurosawa et al. | 438/107 |
| 2009/0042488 A1* | 2/2009 | Sekiya et al. | 451/41 |
| 2010/0084096 A1* | 4/2010 | Saito et al. | 156/378 |
| 2010/0294416 A1 | 11/2010 | Yamamoto et al. | |
| 2011/0232820 A1* | 9/2011 | Yamamoto et al. | 156/60 |
| 2012/0009695 A1* | 1/2012 | Amada et al. | 438/17 |
| 2012/0090763 A1* | 4/2012 | Okuno et al. | 156/64 |
| 2012/0097338 A1* | 4/2012 | Kaneshima et al. | 156/494 |
| 2012/0312468 A1* | 12/2012 | Taga et al. | 156/285 |

FOREIGN PATENT DOCUMENTS

| | | |
|---|---|---|
| JP | 10-330022 | 12/1998 |
| JP | 2005-223190 | 8/2005 |
| JP | 2007-311735 | 11/2007 |
| JP | 2010-272755 | 12/2010 |

* cited by examiner

*Primary Examiner* — Alexander Ghyka
(74) *Attorney, Agent, or Firm* — Young & Thompson

(57) ABSTRACT

To provide a method of manufacturing a semiconductor device including a step of attaching a surface protective tape onto the surface of a wafer which has completed the wafer process, a step of subjecting the back surface of the wafer to back grinding, and a step of attaching a peeling assist tape onto the surface protective tape while vacuum-adsorbing the back surface of the wafer to apply a tension to the assist tape, thereby separating the surface protective tape from the wafer, wherein a vacuum suction system has a peripheral suction system for the peripheral part of the wafer and an internal suction system for the internal region of the wafer.

18 Claims, 25 Drawing Sheets

FIG. 8

| ZONE | PRESSURIZED AREA WITH ROLLERS | AREA RATIO | ROLLER PRESSURE |
|---|---|---|---|
| ZONE 1 | 2514 mm² | 1 | 0.11 MPa |
| ZONE 2 | 4090 mm² | 1.63 (4090/2514) | 0.18 MPa |
| ZONE 3 | 4464 mm² | 1.78 (4464/2514) | 0.20 MPa |
| ZONE 4 | 4090 mm² | 1.63 (4090/2514) | 0.18 MPa |
| ZONE 5 | 2514 mm² | 1 | 0.11 MPa |

METHOD OF MANUFACTURING SEMICONDUCTOR DEVICE

CROSS-REFERENCE TO RELATED APPLICATIONS

The disclosure of Japanese Patent Application No. 2011-223665 filed on Oct. 11, 2011 including the specification, drawings and abstract is incorporated herein by reference in its entirety.

BACKGROUND

The present invention relates to a technology effective when applied to a thin-film wafer handling technology in a manufacturing method of a semiconductor device (or semiconductor integrated circuit device).

Japanese Patent Laid-Open No. 2010-272755 (Patent Document 1) discloses a method of attaching a protective tape to a wafer which method includes monitoring the tape height and adjusting a tension applied to the protective tape based on the monitoring result during an attaching step, thereby relaxing an excessive tension and preventing undesirable warp of the wafer.

Japanese Patent Laid-Open No. 2005-223190 (Patent Document 2) discloses a method of attaching a pressure-sensitive adhesive sheet to a wafer which method includes changing a pressure applied to a roller depending on the width of the wafer, thereby adjusting the pressure applied by the roller to be uniform.

Japanese Patent Laid-Open No. Hei 10(1998)-330022 (Patent Document 3) or U.S. Pat. No. 6,258,198 (Patent Document 4) corresponding to it discloses a method of attaching a protective film, which method includes applying a stronger tension to the protective film in the initial stage when the film is likely to hang down and then applying a weaker tension so as to prevent the film from being brought into contact with the wafer surface, thereby preventing undesirable warp of the wafer.

Japanese Patent Laid-Open No. 2007-311735 (Patent Document 5) discloses a method of separating a protective tape attached to a wafer, which method includes attaching a peeling pressure-sensitive adhesive tape having a relatively narrow width to the vicinity of the end portion of the protective tape while downwardly applying a push out force and stretching the outer end of the peeling pressure-sensitive adhesive tape in a direction crossing the wafer.

[Patent Document 1] Japanese Patent Laid-Open No. 2010-272755
[Patent Document 2] Japanese Patent Laid-Open No. 2005-223190
[Patent Document 3] Japanese Patent Laid-Open No. 10(1998)-330022
[Patent Document 4] U.S. Pat. No. 6,258,198
[Patent Document 5] Japanese Patent Laid-Open No. 2007-311735

SUMMARY

It has been a common practice to conduct back grinding of a wafer while attaching a surface protective tape onto the surface of the wafer when a wafer process of a semiconductor wafer has almost finished; attach a peeling assist tape onto the surface protective tape while vacuum adsorbing the back side of the wafer; and apply a tension to the peeling assist tape and thereby peel the surface protective tape from the wafer.

As a result of investigation by the present inventors, however, it has been elucidated that a vacuum leak from the periphery of a wafer occurs due to a decrease in the target thickness of a wafer caused by back grinding treatment and this makes it more difficult to employ such peeling methods.

The present invention has been made with a view to overcoming the above-mentioned problem.

An object of the invention is to provide a highly reliable manufacturing process of a semiconductor device.

The above-mentioned and other objects and novel features of the invention will be apparent from the description herein and accompanying drawings.

Of the inventions disclosed by the present invention, typical ones will next be described briefly.

One of the inventions is to provide a method of manufacturing a semiconductor device including a step of attaching a peeling assist tape onto a surface protective tape while vacuum adsorbing the backside of a wafer and applying a tension to the peeling assist tape to peel the surface protective tape from the wafer. A vacuum suction system of the vacuum adsorption has a peripheral suction system for a peripheral part of the wafer and an internal suction system for the internal region of the wafer.

Advantages available by the typical invention disclosed herein will next be described briefly.

Described specifically, in a method of manufacturing semiconductor device including a step of attaching a peeling assist tape onto a surface protective tape while vacuum adsorbing the backside of a wafer and applying a tension to the peeling assist tape to peel the surface protective tape from the wafer, a vacuum suction system of the vacuum adsorption is comprised of a peripheral suction system for the peripheral part of the wafer and an internal suction system for the internal region of the wafer so that peeling failures due to generation of a vacuum leak from the periphery of the wafer can be reduced.

BRIEF DESCRIPTION OF THE DRAWINGS

FIG. 8 is a table showing pressure distribution and the like in each zone on the wafer of FIG. 7;

DETAILED DESCRIPTION

Outline of Embodiments

Figure 1:
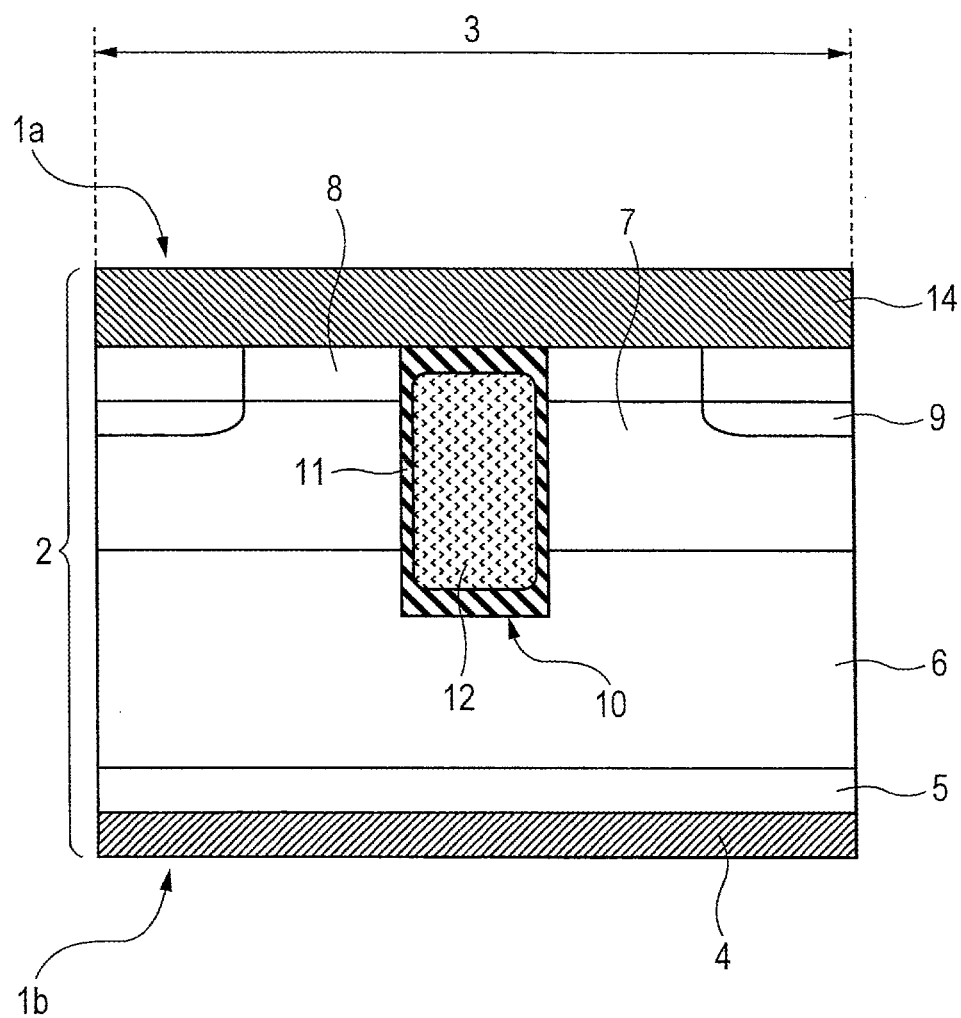
FIG. 1 is a cross-sectional view of a unit cell for describing the main structure of IGBT, which is one example of a target device in a manufacturing method of a semiconductor device in one embodiment of the invention.

First, the outline of typical embodiments of the invention disclosed herein will be described.

1. A method of manufacturing a semiconductor device, including the steps of: (a) forming a semiconductor element over a first main surface of a semiconductor wafer; (b) after the step (a), attaching a surface protective tape onto a substantially entire surface of the first main surface of the semiconductor wafer; (c) performing back grinding of a second main surface of the semiconductor wafer while having the surface protective tape on the substantially entire surface of the first main surface of the semiconductor wafer; (d) after the step (c), attaching an intermediate portion of a peeling pressure-sensitive adhesive tape to an external surface of the surface protective tape from a peripheral vicinity of the surface protective tape to an internal region thereof; and (e) after the step (d), applying a tension containing a component force, which is directed from a portion of the surface protective tape attached to the peripheral vicinity to the internal region, to an externally extended portion of the peeling pressure-sensitive adhesive tape on the side of the peripheral vicinity in relation to the intermediate portion while having the second main surface of the semiconductor wafer adsorbed onto a vacuum adsorption stage, and thereby separating the surface protective tape from the first main surface of the semiconductor wafer. Here, the vacuum adsorption stage has two vacuum suction systems, that is, a peripheral suction system for the peripheral vicinity and an internal suction system for the internal region.

2. The method of manufacturing a semiconductor device as described above in 1, in which the peripheral suction system performs vacuum adsorption of the peripheral part of the wafer, while the internal suction system performs vacuum adsorption of the internal region of the wafer.

3. The method of manufacturing a semiconductor device as described above in 1 or 2, in which application of a tension in the step (e) is performed by means of a pinch roller and the torque of the pinch roller is controlled based on monitoring results of the degree of vacuum of the peripheral suction system so as not to substantially cause a leak in the peripheral suction system.

4. The method of manufacturing a semiconductor device as described above in any one of 1 to 3, in which upon completion of the step (c), the wafer has, on a substantially entire surface thereof, a substantially uniform thickness.

5. The method of manufacturing a semiconductor device as described above in any one of 1 to 3, in which upon completion of the step (c), the wafer is relatively thick at the peripherally annular end portion thereof and the wafer is relatively thin and has a substantially uniform thickness on the substantially entire surface of the internal region thereof.

6. The method of manufacturing a semiconductor device as described above in any one of 1 to 5, further including the steps of: (f) after the step (e), making a probe test of the semiconductor wafer; and (g) after the step (f), attaching a dicing tape onto the substantially entire surface of the second main surface of the semiconductor wafer.

7. The method of manufacturing a semiconductor device as described above in any one of 1 to 6, in which the semiconductor device has a power active element.

8. The method of manufacturing a semiconductor device as described above in any one of 1 to 6, in which the semiconductor device has an IGBT.

9. A method of manufacturing a semiconductor device, including the steps of: (a) forming a semiconductor element over a first main surface of a semiconductor wafer; (b) after the step (a), attaching a surface protective tape onto a substantially entire surface of the first main surface of the semiconductor wafer; (c) carrying out back grinding of a second main surface of the semiconductor wafer while having the surface protective tape on the substantially entire surface of the first main surface of the semiconductor wafer; (d) after the step (c), attaching, to a substantially entire surface of the external surface of the surface protective tape, an intermediate portion of a peeling pressure-sensitive adhesive tape having a width equal to or greater than the diameter of the wafer; and (e) after the step (d), applying, to an externally extended portion of the peeling pressure-sensitive adhesive tape on the side of a peripheral vicinity of the surface protective tape in relation to the intermediate portion, a tension containing a component force, which is directed from a portion of the surface protective tape attached to the peripheral vicinity to the internal region of the surface protective tape, while having the second main surface of the semiconductor wafer adsorbed onto a vacuum adsorption stage, and thereby separating the surface protective tape from the first main surface of the semiconductor wafer.

10. The method of manufacturing a semiconductor device as described above in 9, in which upon completion of the step (c), the wafer has a substantially uniform thickness on the substantially entire surface.

11. The method of manufacturing a semiconductor device as described above in 9, in which upon completion of the step (c), the wafer is relatively thick at the peripherally annular end portion thereof and the wafer is relatively thin and has a substantially uniform thickness on the substantially entire surface of the internal region thereof.

12. The method of manufacturing a semiconductor device as described above in any one of 9 to 11, further including the steps of: (f) after the step (e), making a probe test of the semiconductor wafer; and (g) after the step (f), attaching a dicing tape on the substantially entire surface of the second main surface of the semiconductor wafer.

13. The method of manufacturing a semiconductor device as described above in any one of 9 to 12, in which the semiconductor device has a power active element.

14. The method of manufacturing a semiconductor device according to any one of 9 to 12, in which the semiconductor device has an IGBT.

15. A method of manufacturing a semiconductor device, including the steps of: (a) forming a semiconductor element over a first main surface of a semiconductor wafer; (b) after the step (a), attaching a surface protective tape onto a substantially entire surface of the first main surface of the semiconductor wafer by pressing the surface protective tape with a roller while adding a tension thereto; (c) carrying out back grinding of a second main surface of the semiconductor wafer while having the surface protective tape on the substantially entire surface of the first main surface of the semiconductor wafer; (d) after the step (c), attaching an intermediate portion of a peeling pressure-sensitive adhesive tape to an external surface of the surface protective tape; and (e) after the step (d), applying, to an externally extended portion of the peeling pressure-sensitive adhesive tape on the side of a peripheral vicinity of the surface protective tape in relation to the intermediate portion, a tension containing a component force, which is directed from a portion of the surface protective tape attached to the peripheral vicinity to the internal region of the pressure-sensitive adhesive tape, while having the second main surface of the semiconductor wafer adsorbed onto a vacuum adsorption stage, and thereby separating the surface protective tape from the first main surface of the semiconductor wafer, in which the step (b) is performed while controlling the tension so as to prevent the surface protective tape from getting wrinkled, depending on the position of the roller.

16. The method of manufacturing a semiconductor device as described above in 15, in which in the step (b), the pressure applied to the roller is controlled so that a pressure per unit length of the roller be substantially uniform.

17. The method of manufacturing a semiconductor device as described above in 15 or 16, in which upon completion of the step (c), the wafer has a substantially uniform thickness on the substantially entire surface.

18. The method of manufacturing a semiconductor device as described above in 15 or 16, in which upon completion of the step (c), the wafer is relatively thick at the peripherally annular end portion thereof and the wafer is relatively thin and has a substantially uniform thickness on the substantially entire surface of the internal region thereof.

[Description Form, Basic Terms, and How to Use, in the Present Invention]

1. In the embodiments of the invention, a description will be made after divided in plural sections if necessary for convenience's sake. These plural sections are not independent each other, but in a relation that they are respective portions of a single embodiment, one as details for a portion of the other, or a modified example for a portion or an entire portion, etc. In principle, description on a portion similar to that described before is not repeated. Moreover, when a reference is made to constituent elements in the embodiments, they are not essential unless otherwise specifically indicated, limited to the number theoretically, or principally apparent from the context that they are essential.

Further, the term "transistor", "semiconductor device", or "semiconductor integrated circuit device" as used herein means mainly a simple device of various transistors (active elements) or a device obtained by integrating such a simple device as a main component with a resistor, a capacitor, and the like on a semiconductor chip or the like (for example, a single-crystal silicon substrate). Typical examples of the various transistors include MISFET (metal insulator semiconductor field effect transistor) typified by IBGT (insulated gate bipolar transistor) or MOSFET (metal oxide semiconductor field effect transistor). Here, the term "MOSFET" as used herein not only means a transistor using an oxide film as a gate insulating film but also means a transistor using another insulating film as a gate insulating film.

2. Similarly, with regard to any material, any composition or the like in the description of the embodiments, the term "X made of A" or the like does not exclude X having, as one of the main constituting components thereof, an element other than A unless otherwise specifically indicated or principally apparent from the context that it is not. For example, the term "X made of A" means that "X has A as a main component thereof". It is needless to say that, for example, the term "silicon member" is not limited to a member made of pure silicon but also means a member made of a SiGe alloy or another multi-element alloy having silicon as a main component or a member containing an additive in addition. Similarly, the term "silicon oxide film", "silicon oxide-based insulating film", or the like is not limited to a relatively pure undoped silicon oxide (undoped silicon dioxide) film but needless to say, it embraces an FSG (fluorosilicate glass) film, a TEOS-based silicon oxide film, an SiOC (silicon oxycarbide) film, or a carbon-doped silicon oxide film, a thermal oxidation film such as OSG (organosilicate glass) film, PSG (phosphorus silicate glass) film, or BPSG (borophosphosilicate glass) film, a CVD oxide film, silicon oxide films obtained by the method of application such as SOG (spin on glass) film and nano-clustering silica (NSC) film, silica-based low-k insulating films (porous insulating films) obtained by introducing pores into members similar to them, and composite films each made of any one of the above-mentioned films as a principal constituting element and another silicon-based insulating film.

3. Preferred examples of the shape, position, attribute, and the like will be shown below, however, it is needless to say that the shape, position, attribute, and the like are not strictly limited to these preferred examples unless otherwise specifically indicated or apparent from the context that they are not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor device (which may be a semiconductor integrated circuit device or an electronic device) is to be formed. It is however needless to say that it embraces a composite wafer of an insulating substrate and a semiconductor layer or the like, such as an epitaxial wafer, a SOI substrate, or an LCD glass substrate 6. The term "power semiconductor" as used herein means a semiconductor device capable of treating electric power of several watts or more. Of power semiconductors, power MOSFET and power IBGT (insulated gate bipolar transistor) and the like belong to the group of "insulating gate power transistor". Related-art power IBGT and power MOSFET are all embraced by this group.

IGBT is structurally classified into "trench gate IGBT" and "planar IGBT". In the following embodiments, the trench gate IGBT will be used mainly as an example and described specifically for the convenience of description. [Details of Embodiments] Embodiments will next be described more specifically. In all the drawings, the same or like members will be identified by the same or like symbols or reference numerals and overlapping descriptions will be omitted in principle.

In the accompanying drawings, hatching or the like is sometimes omitted even from the cross-section when it makes the drawing cumbersome and complicated or when a member can be discriminated clearly from a vacant space. In relation thereto, even from a two-dimensionally closed hole, a background contour line thereof may be omitted when it is obvious from the description or the like. On the other hand, even a portion other than a cross section may be hatched to clearly show that the hatched portion is not a vacant space.

1. Description of the structure of the main portion of IBGT which is one example of a target device in the manufacturing method of a semiconductor device in one embodiment of the invention (mainly, FIG. 1)

In the following examples, a non-punch-through type IBGT (power active element) will be described specifically as an example, but needless to say, the description will also be applied to a punch-through type IGBT.

FIG. 1 is a cross-sectional view of a unit cell for describing the main structure of IGBT, which is one example of a target device in a manufacturing method of a semiconductor device in one embodiment of the invention. Based on this diagram, the structure of the main portion of IGBT, which is one example of a target device of a manufacturing method of a semiconductor device in one embodiment of the invention, will next be described.

In general, an IGBT device chip is a semiconductor chip, for example, several mm square and a device surface $1a$ (FIG. 1), that is, a surface having an emitter electrode, is comprised of a cell region occupying most of the internal region and a chip peripheral structure around the cell region. Typically, the chip has, on the device surface thereof, an emitter metal electrode and a gate metal electrode, while it has, on the back side thereof, a collector metal electrode. The cell region is comprised of, for example, a one-dimensional periodic pattern of a number of elongated unit cell regions 3 (FIG. 1). The cross-section of the chip 2 in a portion of the unit cell region 3 is shown in FIG. 1. As shown in FIG. 1, the chip has, on a substantially entire back surface $1b$ thereof, a backside metal electrode 4 and the back surface $1b$ has inside thereof a P+ type collector region 5. A relatively thick layer above the P+ type collector region 5 is an N type drift region 6. The N type drift region 6 has, on the side of the device surface $1a$, a P type body region 7 (channel region). The P type body region 7 has, on the side of the device surface $1a$, an N+ type emitter region 8. A trench 10 is provided so as to penetrate through the P type body region 7 and the N+ type emitter region 8 from the surface toward the N type drift region 6. A P+ type body contact region 9 is provided so as to penetrate through the surface of the N+ type emitter region 8 toward the P type body region 7. The trench 10 has, inside thereof, a gate electrode 12 via a gate insulating film 11 and it has, on the device surface $1a$ thereof, for example, an aluminum-based metal electrode layer, that is, an emitter metal electrode 14.

2. Description of a step of attaching a back-grinding surface protective tape in the manufacturing method of a semiconductor device according to the one embodiment of the invention (mainly from FIG. 2 to FIG. 11)

A specific description will next be made with, as an example, a process using a single crystal silicon wafer made by FZ (floating zone melting) method as an initial material. Needless to say, it is possible to employ a process using a single crystal silicon wafer made by CZ (Czochralski) method as an initial material.

Further, a description will hereinafter be made specifically on a process using a wafer having a diameter of 150Φ. The diameter of the wafer is however not limited to 150Φ and any diameter, for example, 100Φ, 200Φ, 300Φ, or 450Φ may be used if possible. Moreover, a description will hereinafter be made with a device having a withstand voltage of from 300V to 600V or so as an example, but needless to say, a device having another withstand voltage can also be used almost as is after taking a proper measure such as change in the thickness of its drift region.

Figure 2:
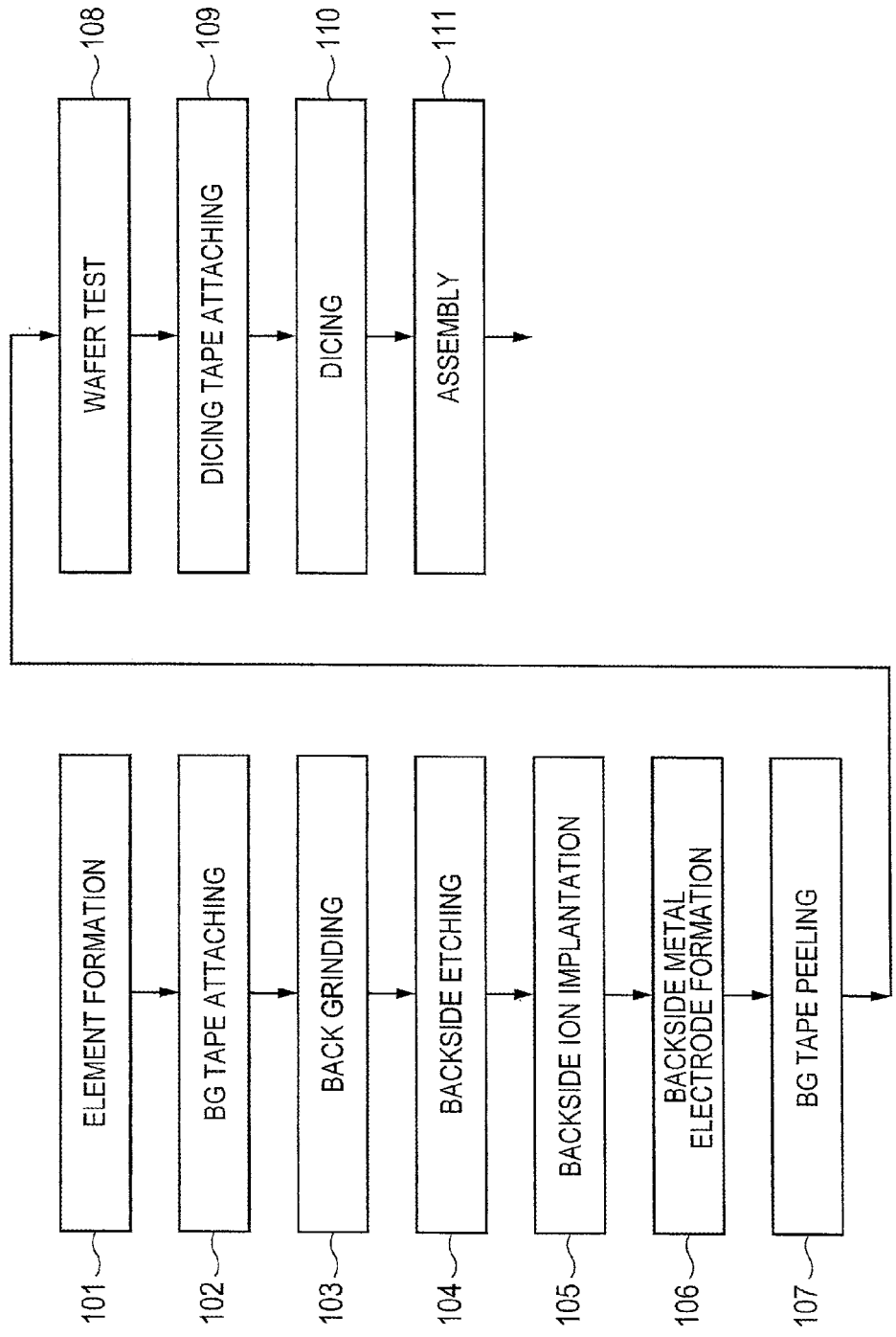
FIG. 2 is a block flow chart of the main process of the manufacturing method of a semiconductor device according to the one embodiment of the invention.
Figure 3:
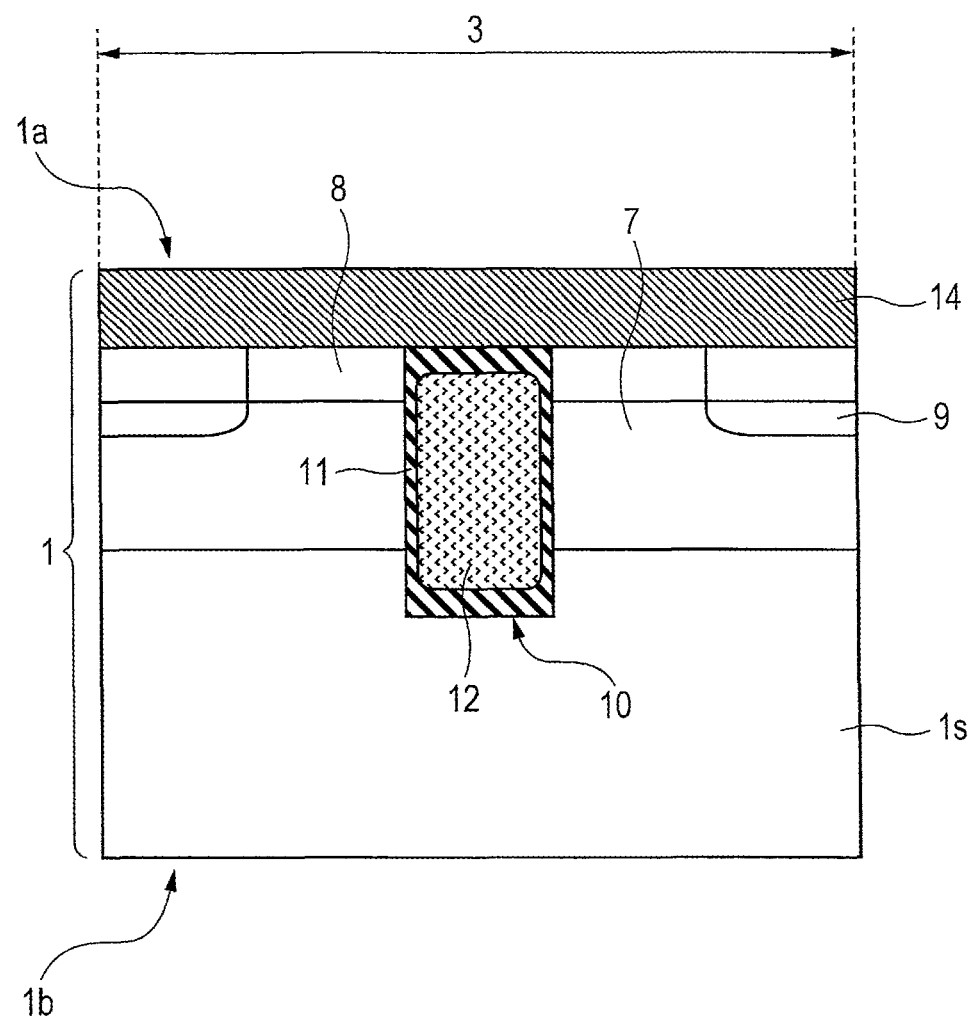
FIG. 3 is a cross-sectional view of a unit cell corresponding to FIG. 1 prior to starting of a step of attaching a surface protective tape for back grinding in the manufacturing method of a semiconductor device according to the one embodiment of the invention.
Figure 4:
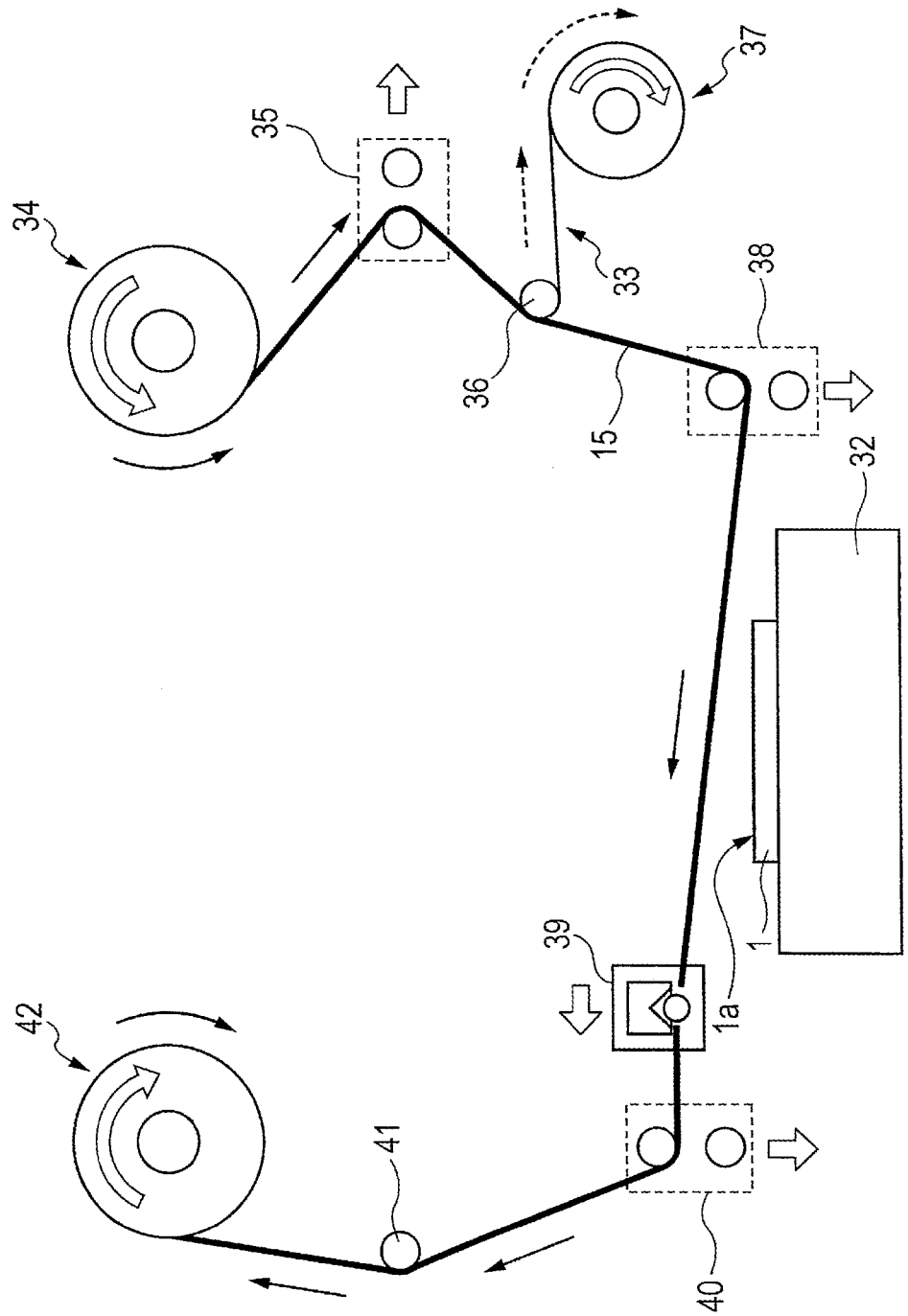
FIG. 4 is a schematic cross-sectional view of a BG tape attaching apparatus to be used in one sub-step (BG tape feeding step) of the step of attaching a surface protective tape for back grinding in the manufacturing method of a semiconductor device according to the one embodiment of the invention.
Figure 5:
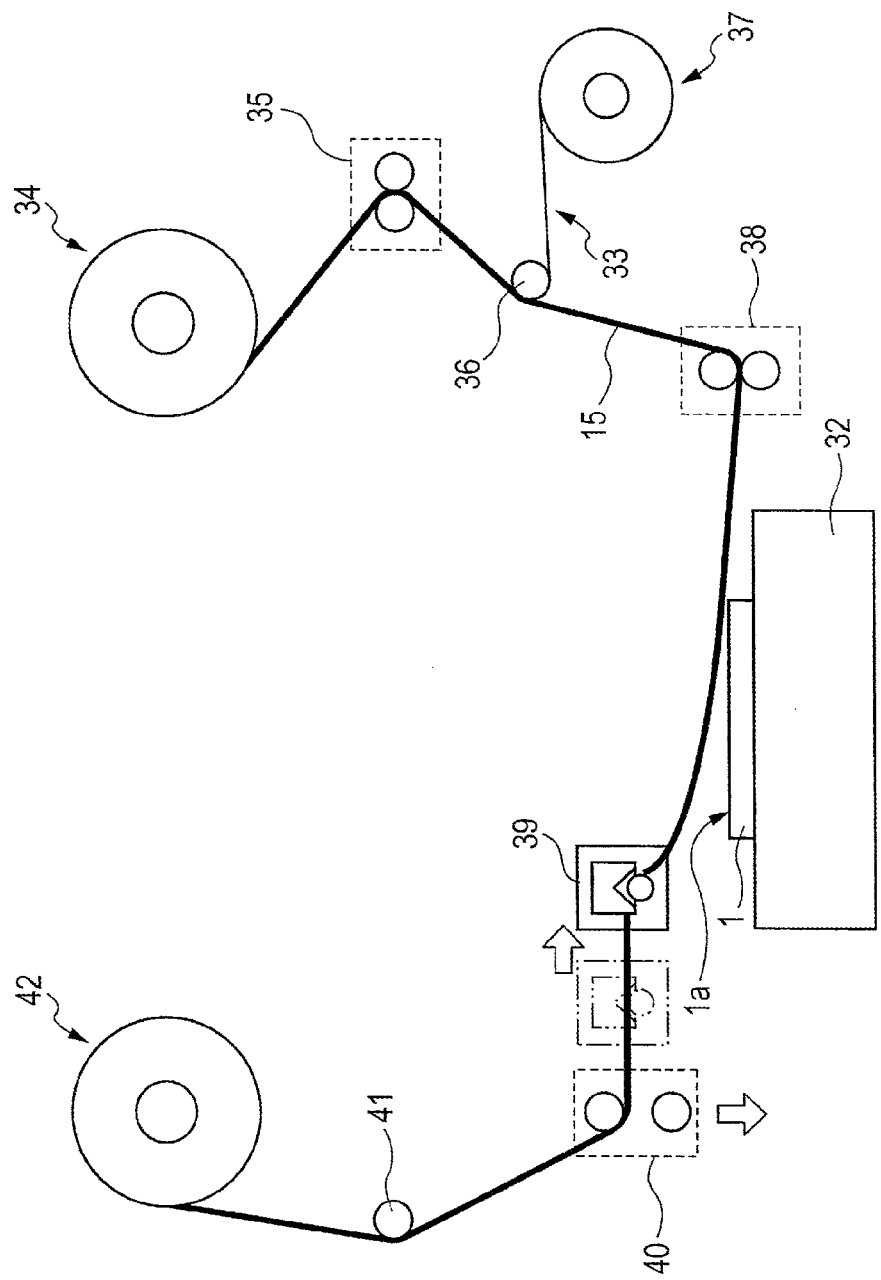
FIG. 5 is a schematic cross-sectional view of a BG tape attaching apparatus to be used in one sub-step (BG tape returning step) of the step of attaching a surface protective tape for back grinding in the manufacturing method of a semiconductor device according to the one embodiment of the invention.
Figure 6:
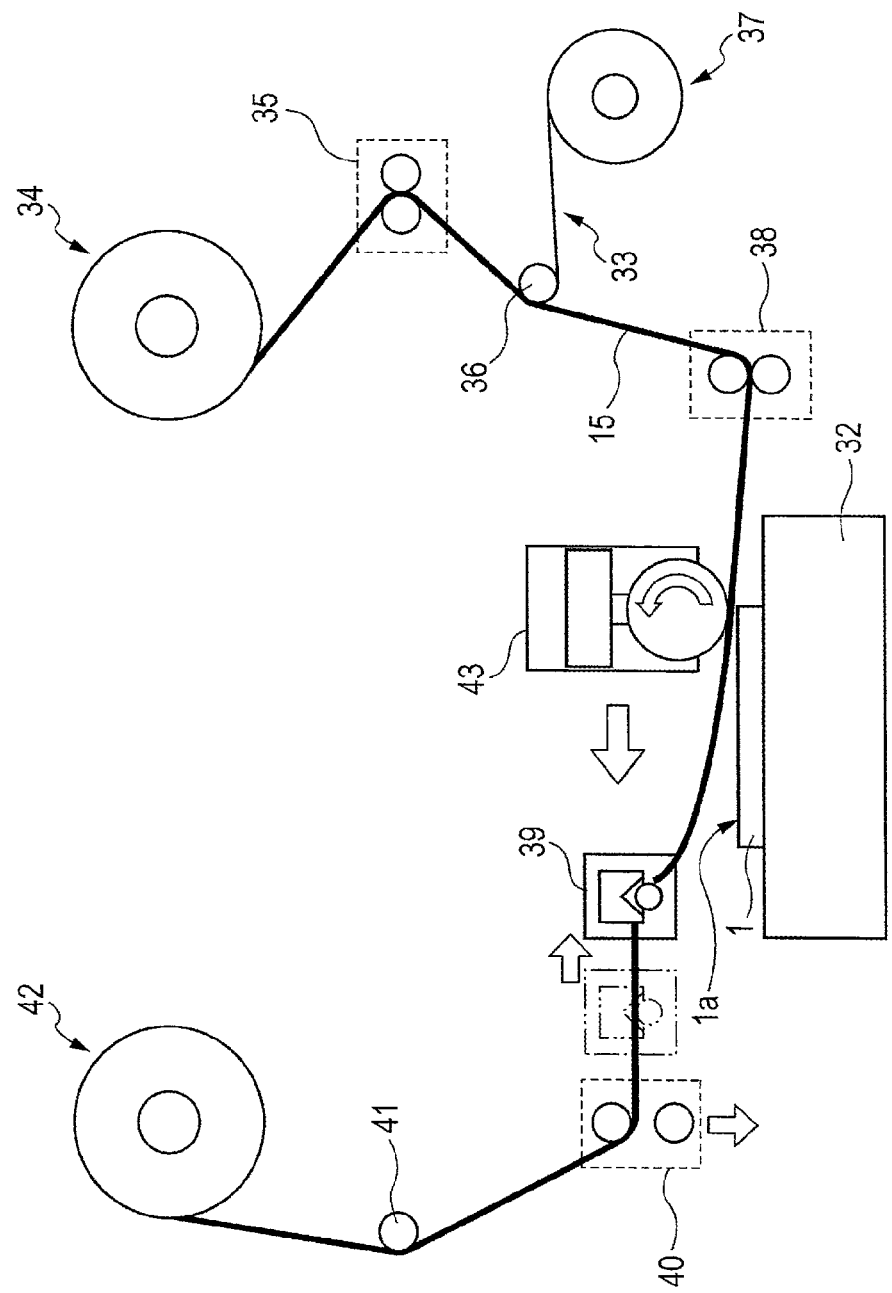
FIG. 6 a schematic cross-sectional view of a BG tape attaching apparatus to be used in one sub-step (BG tape attaching step) of the step of attaching a surface protective tape for back grinding in the manufacturing method of a semiconductor device according to the one embodiment of the invention.
Figure 7:
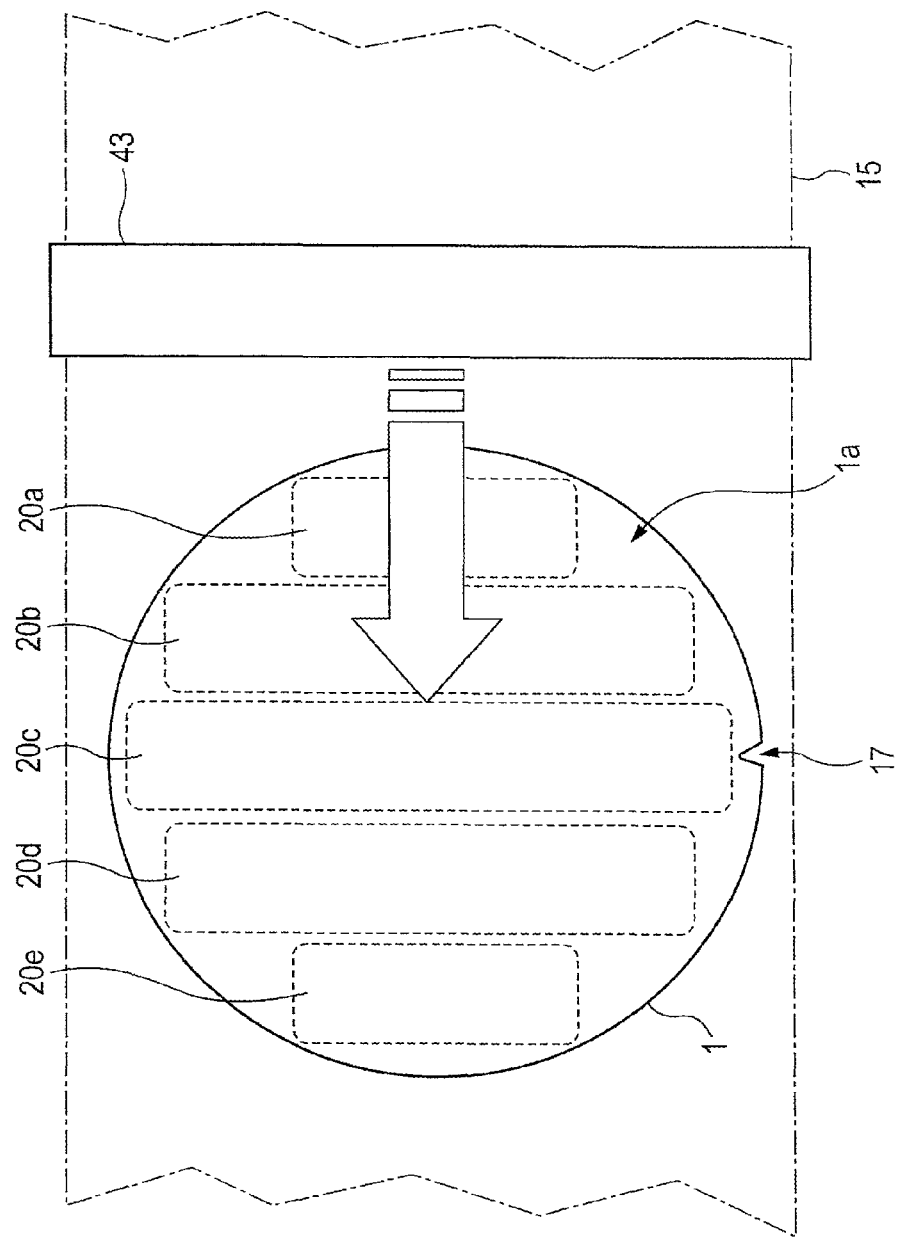
FIG. 7 is a schematic explanatory view of pressure applying conditions based on the information of FIG. 6.
Figure 9:
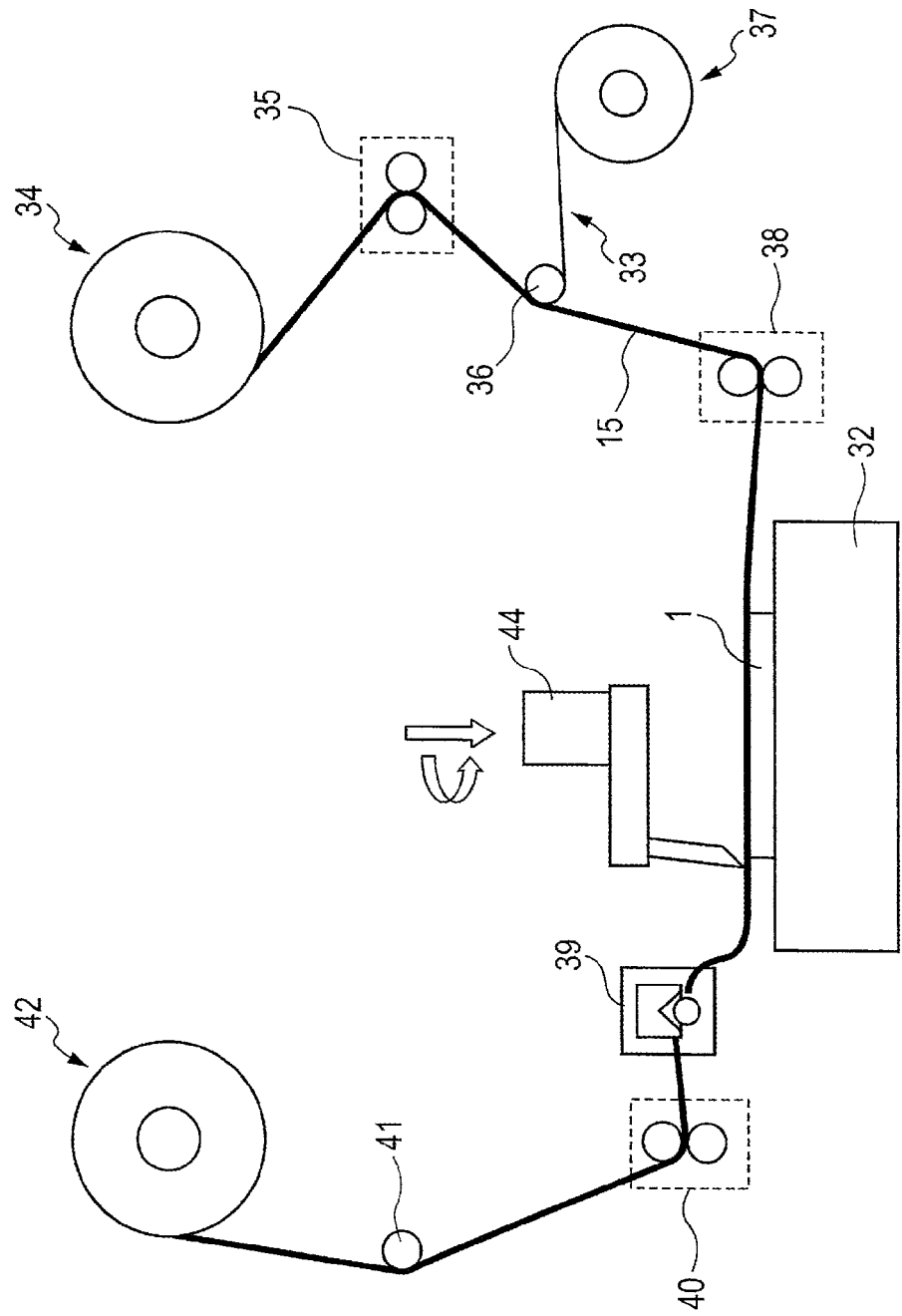
FIG. 9 is a schematic cross-sectional view of a BG tape attaching apparatus to be used in one sub-step (BG tape cutting step) of the step of attaching a surface protective tape for back grinding in the manufacturing method of a semiconductor device according to the one embodiment of the invention.
Figure 10:
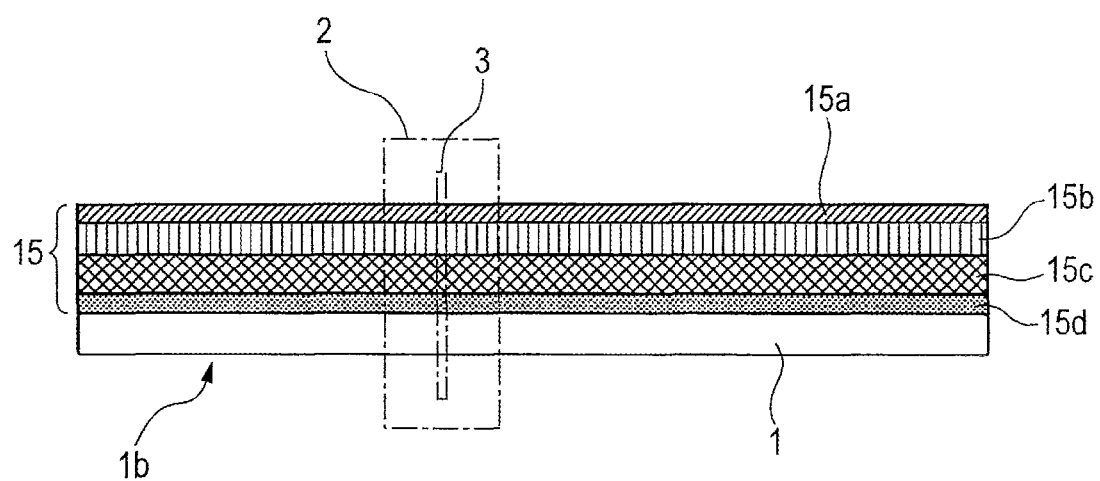
FIG. 10 is an overall cross-sectional view of a wafer and a BG tape after cutting of the BG tape.
Figure 11:
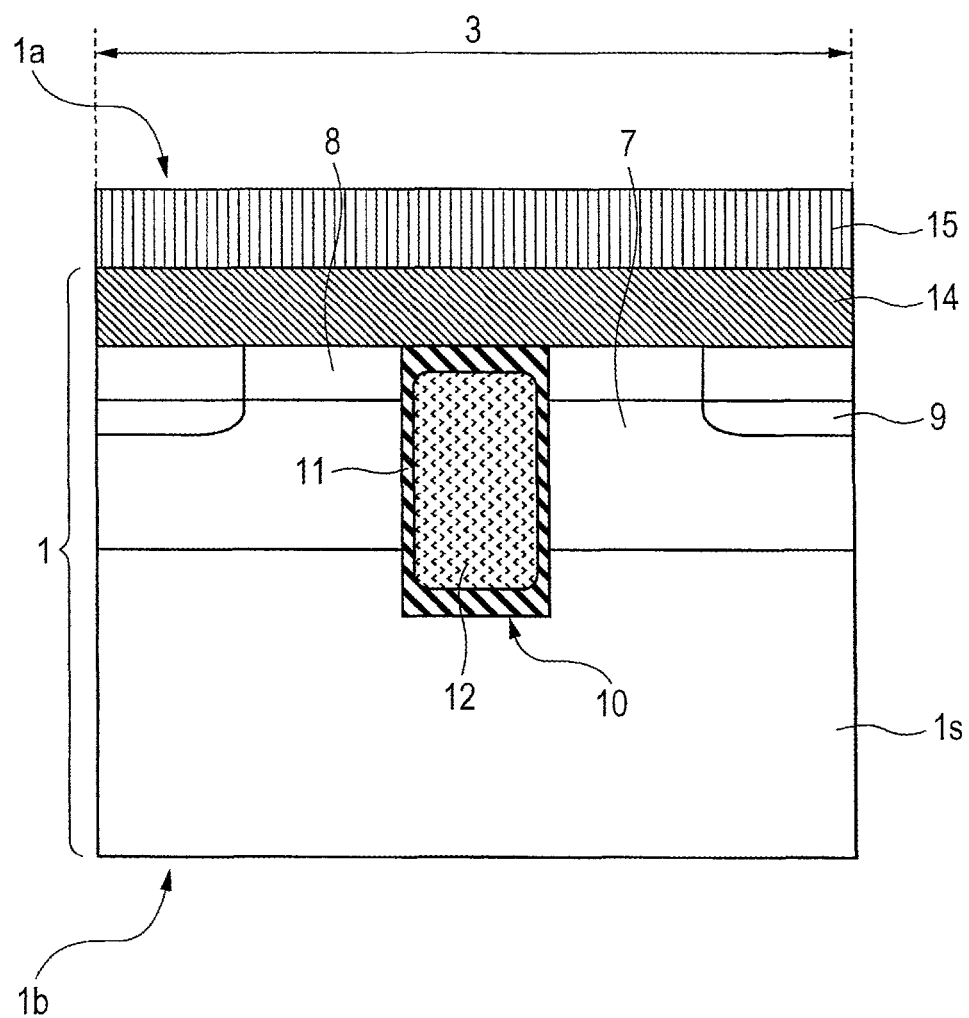
FIG. 11 is a cross-sectional view of a unit cell, corresponding to FIG. 1, of the unit cell region 3 of FIG. 10.

FIG. 2 is a block flow chart of the main process of the manufacturing method of a semiconductor device according to the one embodiment of the invention. FIG. 3 is a cross-sectional view of a unit cell corresponding to FIG. 1 prior to starting of a step of attaching a back-grinding surface protective tape in the manufacturing method of a semiconductor device according to the one embodiment of the invention. FIG. 4 is a schematic cross-sectional view of a BG tape attaching apparatus to be used in one sub-step (BG tape feeding step) of the step of attaching a back-grinding surface protective tape in the manufacturing method of a semiconductor device according to the one embodiment of the invention. FIG. 5 is a schematic cross-sectional view of a BG tape attaching apparatus to be used in one sub-step (BG tape returning step) of the step of attaching a back-grinding surface protective tape in the manufacturing method of a semiconductor device according to the one embodiment of the invention. FIG. 6 is a schematic cross-sectional view of a BG tape attaching apparatus to be used in one sub-step (BG tape attaching step) of the step of attaching a back-grinding surface protective tape in the manufacturing method of a semiconductor device according to the one embodiment of the invention. FIG. 7 is a schematic explanatory view of pressure applying conditions based on the information of FIG. 6. FIG. 8 is a table showing pressure distribution and the like in each zone on the wafer of FIG. 7. FIG. 9 is a schematic cross-sectional view of a BG tape attaching apparatus to be used in one sub-step (BG tape cutting step) of the step of attaching a back-grinding surface protective tape in the manufacturing method of a semiconductor device according to the one embodiment of the invention. FIG. 10 is an overall cross-sectional view of a wafer and a BG tape after cutting of the BG tape. FIG. 11 is a cross-sectional view of a unit cell, corresponding to FIG. 1, of the unit cell region 3 of FIG. 10. Based on them, steps including a step of attaching a back-grinding surface protective tape grinding in the manufacturing method of a semiconductor device according to the one embodiment of the invention will be described.

Of the wafer process, steps after a step of forming a final passivation film and forming necessary openings (gate opening and emitter opening) in the final passivation film will next be described specifically in principle (FIG. 3 does not include this final passivation film due to the positional relationship). It is to be noted that the final passivation film may be an organic film such as polyimide-based resin film or it may be an inorganic film such as silicon oxide-based insulating film or silicon nitride-based insulating film. It may also be a composite film of these inorganic films or a composite film of the organic film (upper layer) and the inorganic film (lower layer).

First, procedures to obtain the structure of FIG. 3 will be described briefly referring to this diagram. For example, a 150Φ N-type single crystal silicon wafer 1s (for example, about 700 µam thick) is prepared. Then, a trench is made 10 in a surface 1a (first main surface) of a semiconductor wafer 1s (1) by anisotropic dry etching or the like. The trench is filled with an electrode material such as polysilicon via a gate insulating film 11 by using etching back and oxide film formation in combination to form a gate electrode 12. Next, ions are implanted from the side of the surface 1a (first main surface) of the semiconductor wafer 1s (1) to form a P type body region 7, followed by successive formation of an N+ type emitter region 8, and a P+ type body contact region 9. Next, on the side of the surface 1a of the semiconductor wafer 1, an aluminum-based metal film is formed via a barrier metal film such as TiW film, for example, by sputtering. These barrier metal film and aluminum-based metal film are patterned through related-art lithography to form an emitter metal electrode 14. Then, formation of a final passivation film and formation of necessary openings (gate opening, emitter opening) in the final passivation film are conducted to obtain the structure shown in FIG. 3. Thus, an element formation step 101 shown in FIG. 2 is completed.

Next, a BG tape 15 (surface protective tape) attaching step 102 (FIG. 2) will be described. As shown in FIG. 4, the wafer 1 shown in FIG. 3 is vacuum adsorbed onto a wafer adsorption stage 32 on a BG tape attaching apparatus with the device surface 1a up. Under such a state, a composite tape composed of a BG tape 15 and a separation tape 33 wound around a BG tape feed unit 34 passes through a pre-separation tape chuck 35 and is separated into the BG tape 15 and the separation tape 33 at a separation bar 36. The separation tape 33 is taken up into a separation tape take-up unit 37. On the other hand, the BG tape 15 is supplied to the upper portion of the device surface 1a of the wafer 1 by means of a tension control mechanism 39. Then, the BG tape 15 is taken up by a BG tape take-up unit 42 via the tension control mechanism 39, a BG tape discharge tape chuck 40, and a BG tape take-up relay bar 41. When supply of a new portion of the BG tape 15 is completed in such a manner, the tension control mechanism 39 chucks the BG tape 15 and moves horizontally to a direction distant from the wafer 1, by which a predetermined tension is given to the BG tape 15. Under such a state, a BG tape supply tape chuck 38 and the BG tape discharge pinch roller tape chuck 40 open.

Next, as shown in FIG. 5, when the BG tape 15 on the side of the BG tape supply tape chuck 38 is brought into contact with the wafer 1, the BG tape supply tape chuck 38 closes. Then, the tension control mechanism 39 chucks the BG tape 15 and moves horizontally toward the wafer 1, and thereby relaxes the tension applied to the BG tape 15.

Then, as shown in FIG. 6, an attaching roller 43 attaches the BG tape 15 to the device surface 1a of the wafer 1 while horizontally moving from the side of the BG tape supply tape chuck 38 to the side of the BG tape discharge tape chuck 40. At this time, the BG tape discharge tape chuck 40 opens further, while the tension control mechanism 39 horizontally moves to the direction approaching to the wafer 1 so that the tension to the BG tape 15 is relaxed to a certain degree. Described specifically, in the procedures from FIG. 5 to FIG. 6 (all the procedures of an attaching operation by a roller), the tension to the surface protective tape 15 is adjusted to a relatively low value so as to prevent the surface protective tape 15 from getting wrinkled. In other words, in all the procedures of an attaching operation by a roller, the attaching operation is performed while giving to the surface protective tape 15 a tension not causing wrinkles on the tape.

A load applied to the attaching roller 43 during attaching operation may be constant, but by setting it as shown in FIGS. 7 and 8, an internal strain remaining in the BG tape 15 after attaching can be reduced. This means that application of a pressure to the roller is controlled so that the pressure per length of the roller be substantially uniform, depending on the position of the roller. The reduction in the internal strain of the BG tape 15 is effective for a reduction in the warp of the wafer 1 after grinding.

A loading method to this attaching roller 43 can be described as follows. Described specifically, as a result of application of a pressure to the attaching roller 43, a certain strain occurs so that a contact area with the wafer 1 (to be exact, the upper surface of the BG tape 15) is proportional to the length of a chord of the wafer 1 which the attaching roller 43 crosses. This means that when a predetermined load is applied to the attaching roller 43, a pressure applied per unit area varies inversely proportional to the length of the chord, depending on the position on the wafer 1. In this example, therefore, when the attaching roller 43 is moved, the upper surface 1a of the wafer 1 is divided into five regions 20a, 20b,

20c, 20d, and 20e equal in width (in this example, having a width of about 30 mm) as shown in FIG. 7 with a notched portion 17 as a side and, for example, as shown in FIG. 8, a pressure applied to the attaching roller 43 is determined so that the pressure applied per unit area be almost a uniform value. In this example, the upper surface 1a of the wafer 1 is divided into five zones, that is, zone 1 (20a), zone 2 (20b), zone 3 (20c), zone 4 (20d), and zone 5 (20e), but the number of zones is not limited and in addition, these zones do not necessarily have an equal width. The load may be changed continuously. The notched portion 17 may be placed in any direction.

After attaching by the attaching roller 43 is completed, the body (a portion to be taken up by the BG tape take-up unit 42) of the BG tape 15 is separated from a portion attached to the wafer 1 by a tape cutter 44 as shown in FIG. 9.

Next, an overall schematic cross-section of the BG tape 15 separated from the body of the BG tape 15 and the wafer 1 is shown in FIG. 10. As shown in FIG. 10, the following is one example of an overlapping structure of the BG tape 15. Described specifically, a base material layer is comprised of a top PET base material layer 15a (for example, about 25 µm thick) and an intermediate EVA base material layer 15b (for example, about 120 µm thick). The top layer has high rigidity, while the intermediate layer has relatively low rigidity but is effective for removing the bending tendency. The base material layers 15a and 15b have therebelow an acrylic flexible layer 15c (for example, about 80 µm thick) serving as a cushion layer. The bottom layer meaning a pressure-sensitive adhesive layer is made of an acrylic pressure-sensitive adhesive layer 15d (for example, about 10 µm thick). The overlapping structure of the BG tape 15 may have any configuration, but employing the structure containing a high-rigidity base material layer as shown here is effective for reducing the warp of the wafer 1 after grinding.

The cross-sectional view of the unit cell region 3 which is a portion of the cell region of the chip region 2 shown in FIG. 10 is shown in FIG. 11. It is almost similar to that of FIG. 3, but the BG tape 15 has been attached on the side of the surface 1a.

3. Description of a back grinding step and the like in the manufacturing method of a semiconductor device according to the one embodiment of the invention (mainly, FIG. 2 and FIG. 12 to FIG. 15)

With regard to the cross-sectional shape of the wafer after back grinding, that using a flat wafer system (FIG. 13) will next be described mainly, but needless to say, a peripheral ring-shaped thick system (FIG. 14) may be employed.

Figure 12:
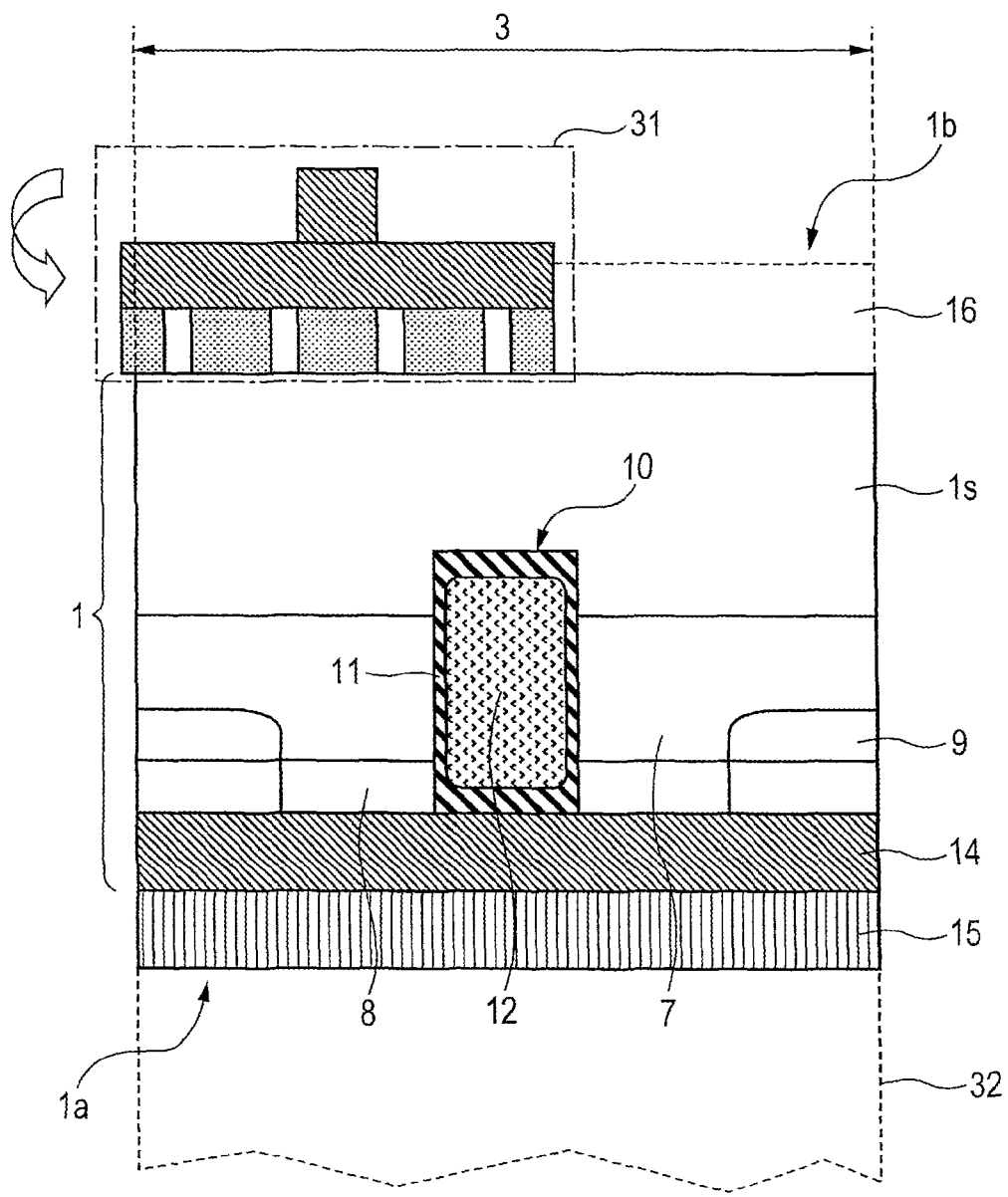
FIG. 12 is a cross-sectional view of a unit cell corresponding to FIG. 1 in a back grinding step, for describing the back grinding step in the manufacturing method of a semiconductor device according to according to the one embodiment of the invention.
Figure 13:
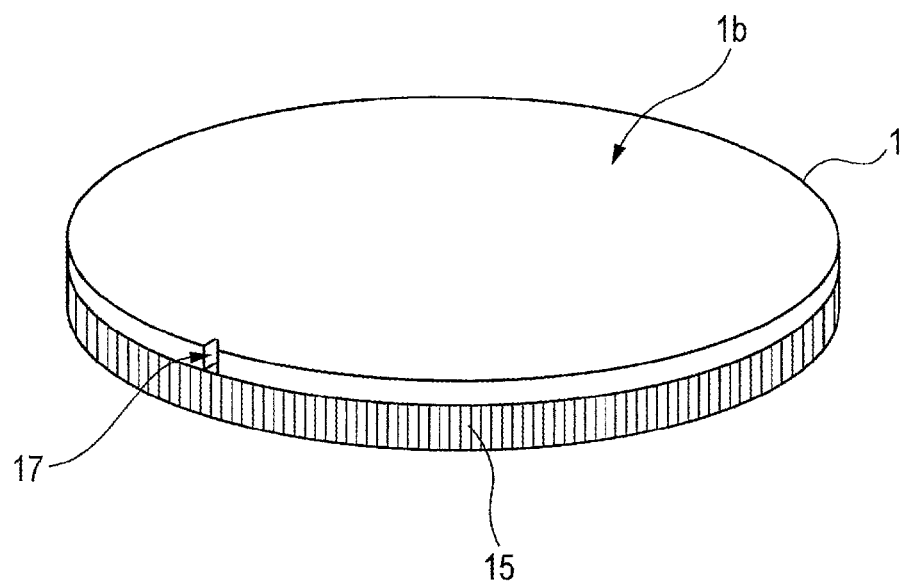
FIG. 13 is an overall perspective view of a flat wafer after completion of the back grinding step.
Figure 14:
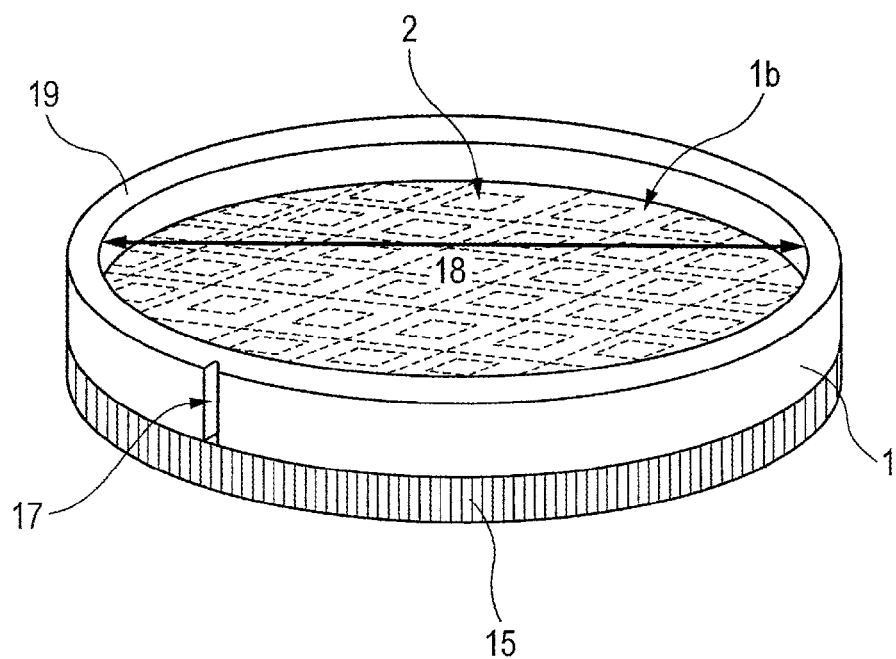
FIG. 14 is an overall perspective view of a wafer with a peripheral ring-shaped thick portion (modification example of the cross-section of a wafer) after completion of the back grinding step.
Figure 15:
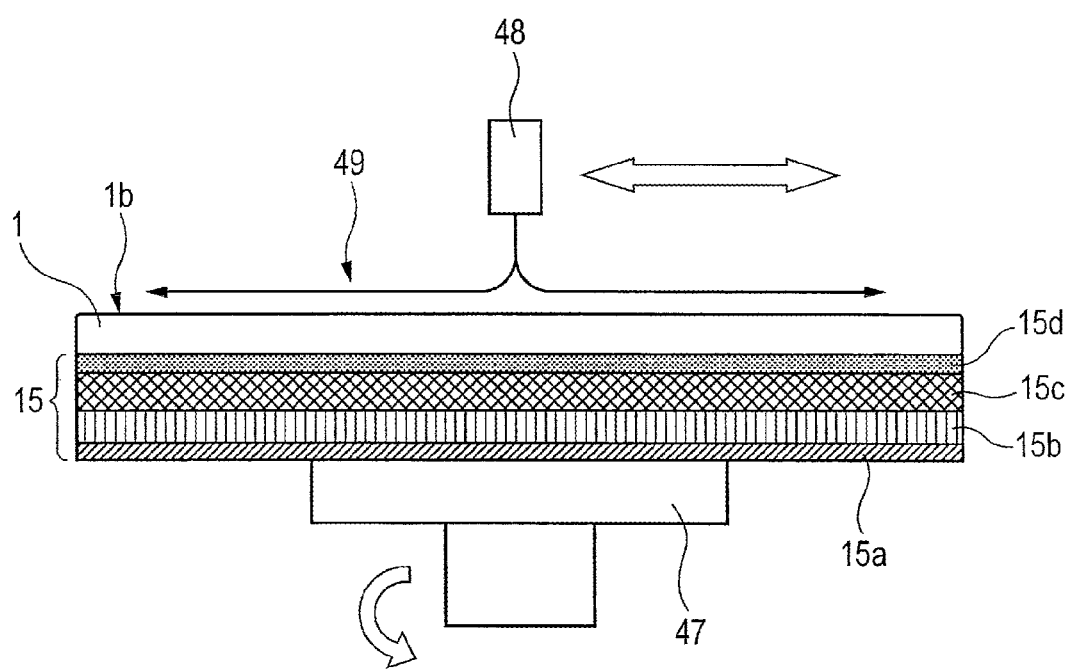
FIG. 15 is an overall schematic sectional view of the wafer in a backside etching step.

FIG. 12 is a cross-sectional view of a unit cell corresponding to FIG. 1 in a back grinding step, for describing the back grinding step in the manufacturing method of a semiconductor device according to according to the one embodiment of the invention. FIG. 13 is an overall perspective view of a flat wafer after completion of the back grinding step. FIG. 14 is an overall perspective view of a wafer with a peripheral ring-shaped thick portion (modification example of the cross-section of a wafer) after completion of the back grinding step. FIG. 15 is an overall schematic sectional view of the wafer in a backside etching step. Based on these diagrams, the back grinding step and the like in the manufacturing method of a semiconductor device according to the one embodiment of the invention will next be made.

After the wafer in the form as shown in FIG. 11 is placed upside down, the back grinding step 103 as listed in FIG. 2 is started. Described specifically, as shown in FIG. 12, the back surface 1b of the wafer 1 adsorbed, on the side of the BG tape 15, to a wafer adsorption stage 32 of a grinding apparatus is ground by a rotary blade such as grinding blade 31 to remove an upper end portion 16. Here, the wafer 1 is ground to a thickness of about 60 µm (preferably from about 50 µm to 150 µm), though depending on the withstand voltage or the like.

The wafer 1 after this back grinding step is able to have a shape as shown in FIG. 13, that is, a substantially uniform thickness on the substantially entire surface (which will be called "flat wafer system"). On the other hand, the wafer 1 after this back grinding step is also able to have a shape as shown in FIG. 14 (which will be called "circularly and peripherally thick wafer system"). In the circularly and peripherally thick wafer system, grinding of the back surface 1b of the wafer 1 is conducted only in an internal region 18 (thickness after the back grinding step is, for example, about 60 µm) so that a thick peripherally annular end portion 19 (for example, about 700 µm thick) remains at the periphery of the wafer 1. This means that the internal region 18 is relatively thin on the substantially entire surface and has a substantially uniform thickness.

Such a thick peripherally annular end portion 19 is advantageous because it facilitates handling of the wafer 1 even after removal of the BG tape 15. This, however, slightly complicates the back grinding step and the like. In addition, the peripherally annular end portion 19 should be removed immediately before dicing.

Next, as shown in FIG. 15, a backside etching step 104 (FIG. 2) after the back grinding step is conducted. This step is conducted because the wafer has, on the back surface thereof, a deteriorated layer having a micron-order thickness after the back grinding. The etching thickness is therefore from about 1 µm to several 1 µm. Described specifically, as shown in FIG. 15, the wafer 1 rotates on its axis while being adsorbed, on the side of the BG tape 15 of the wafer 1, to a wafer adsorption spin stage 47 of a spin etching apparatus. At this time, the back surface 1b of the wafer 1 is supplied with a wet etching solution 49, for example, fluoro-nitric acid (a mixed aqueous solution of hydrofluoric acid and nitric acid) and is etched therewith. After completion of the etching, the wafer 1 is rinsed, for example, with water.

4. Description on a backside ion implantation step and the like in the manufacturing method of a semiconductor device according to the one embodiment of the invention (mainly, FIG. 2 and FIG. 25)

Here, an example of forming a collector region by introducing P type impurities from the back side will be described specifically. Needless to say, the collector region may be formed by forming an N type region or the like on a P type substrate by epitaxial growth. As described below, ion implantation from the back side by using a single crystal substrate makes it possible to reduce a manufacturing cost greatly.

Figure 25:
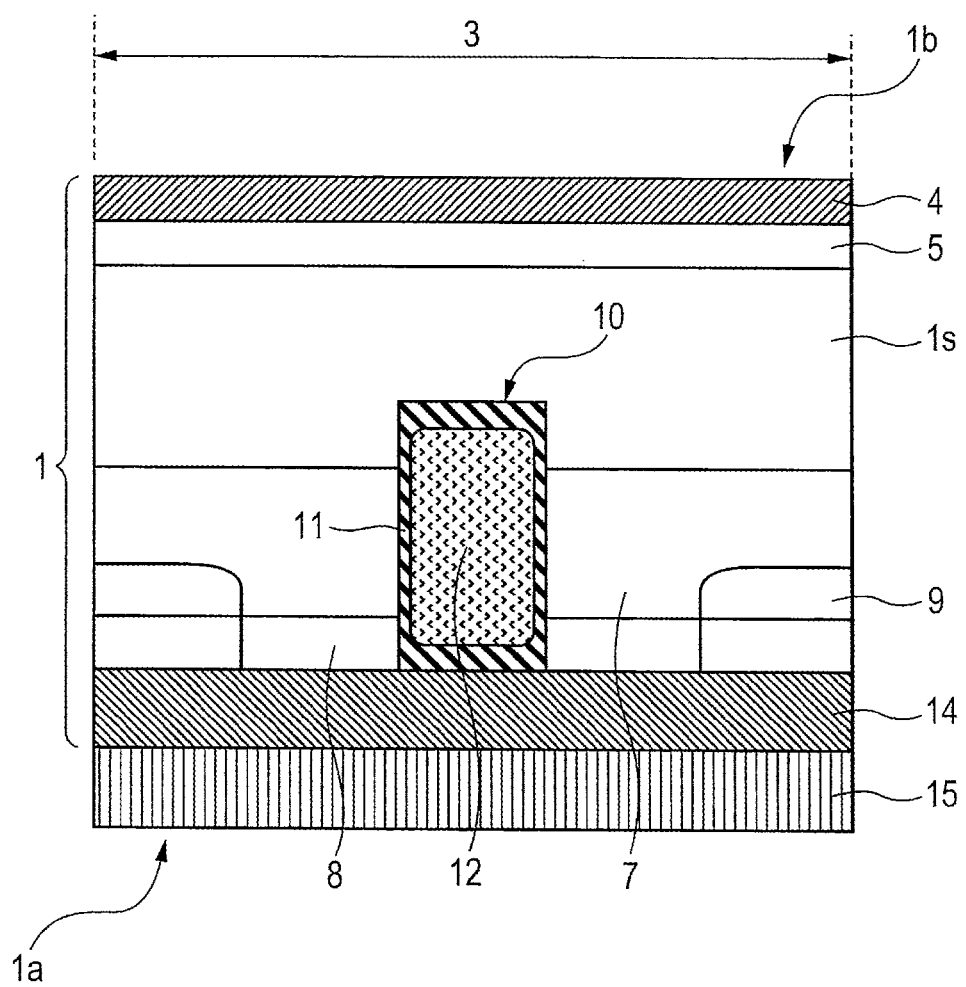
FIG. 25 is a cross-sectional view of a unit cell corresponding to FIG. 1 for describing a backside ion implantation step or the like in the manufacturing method of a semiconductor device according to the one embodiment of the invention.

FIG. 25 is a cross-sectional view of a unit cell corresponding to FIG. 1 for describing a backside ion implantation step or the like in the manufacturing method of a semiconductor device according to the one embodiment of the invention. Based on it, the backside ion implantation step and the like in the manufacturing method of a semiconductor device according to the one embodiment of the invention will next be described.

After completion of the backside etching step 104 in FIG. 2, the resulting wafer 1 is subjected to the backside ion implantation step 105 (FIG. 2) as shown in FIG. 25. In this step, boron ions are implanted from the back surface 1b of the wafer 1 to form a P+ type collector region 5. This step is followed by necessary activation annealing. Then, a backside metal electrode 4 is formed, for example, by sputtering (backside metal electrode formation step 106 of FIG. 2).

5. Description on a back-grinding surface protective tape peeling step in the manufacturing method of a semiconductor device according to the one embodiment of the invention (mainly, FIG. 2, FIG. 16 to FIG. 24, and FIG. 26)

Figure 21:
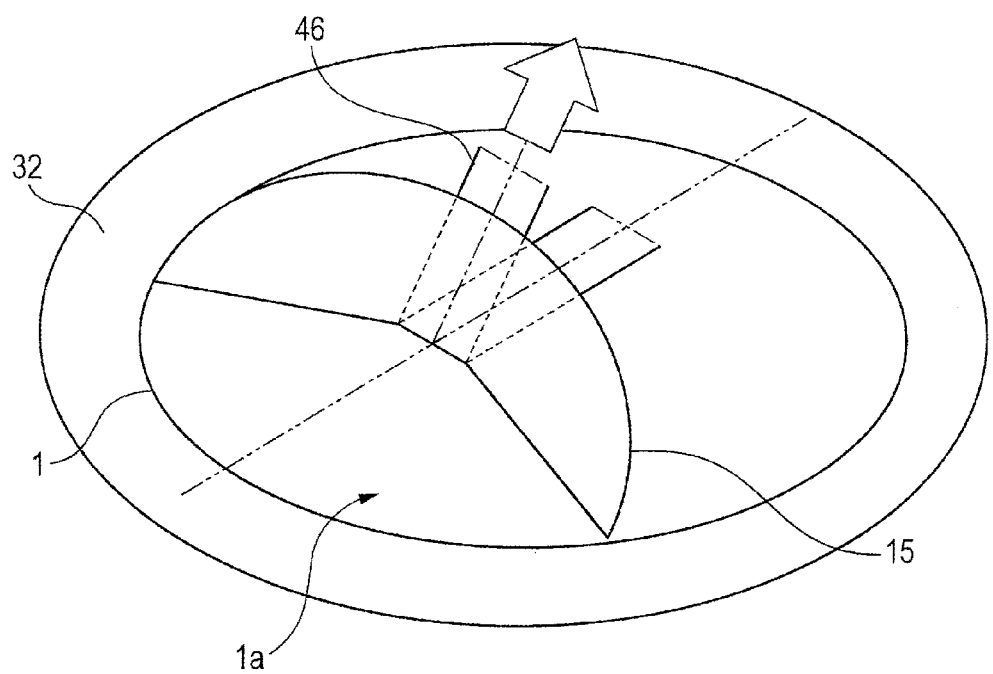
FIG. 21 is an enlarged perspective view (example of narrow-width peeling tape) at the periphery of the wafer shown in FIG. 20.
Figure 22:
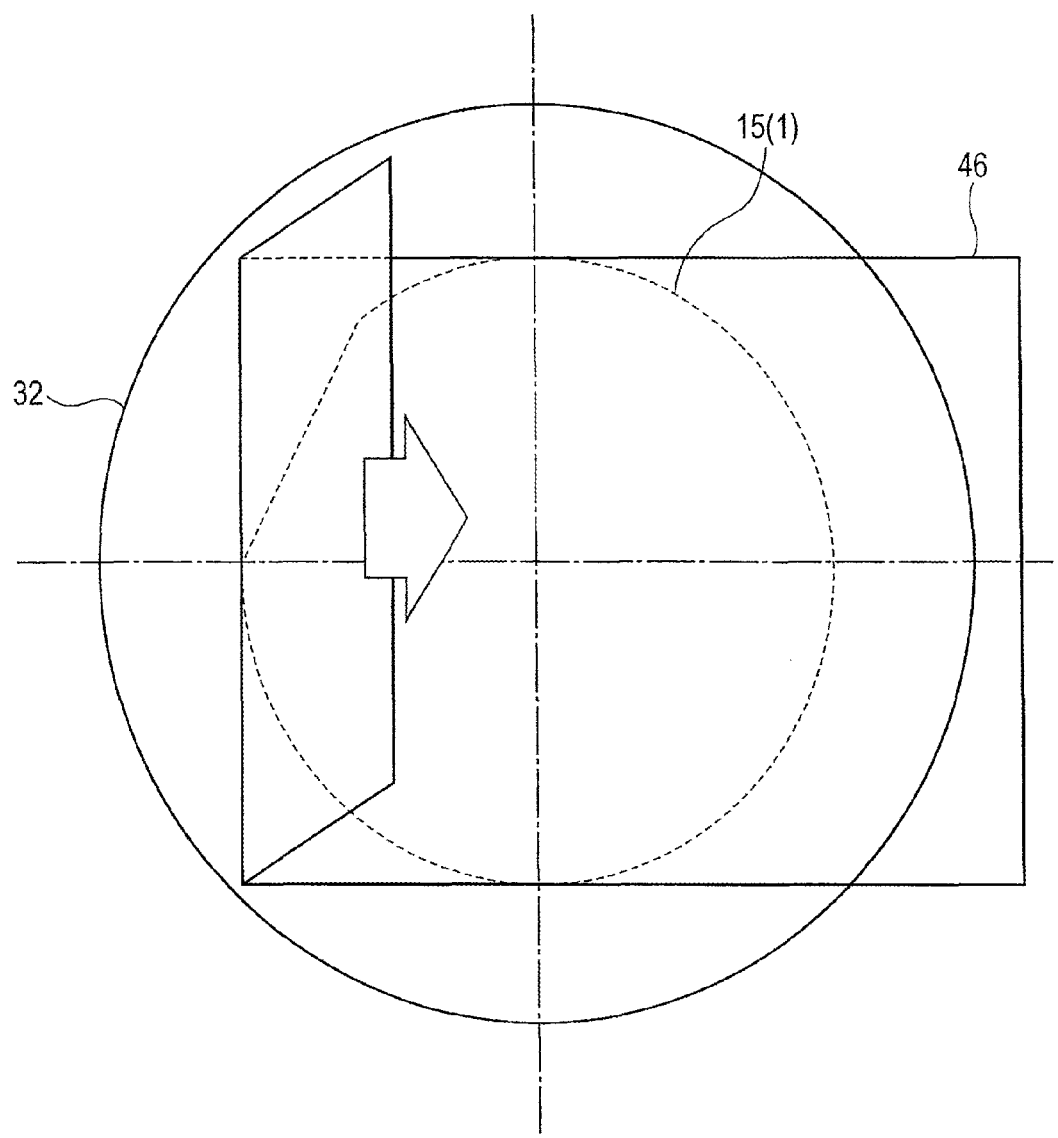
FIG. 22 is an enlarged false top view (modification example using a broad-width peeling tape) at the periphery of the wafer shown in FIG. 20.

In this section, a narrow-width peeling tape system (FIG. 21) will be described mainly, but needless to say, it may be replaced by a broad-width peeling tape system (FIG. 22).

Figure 16:
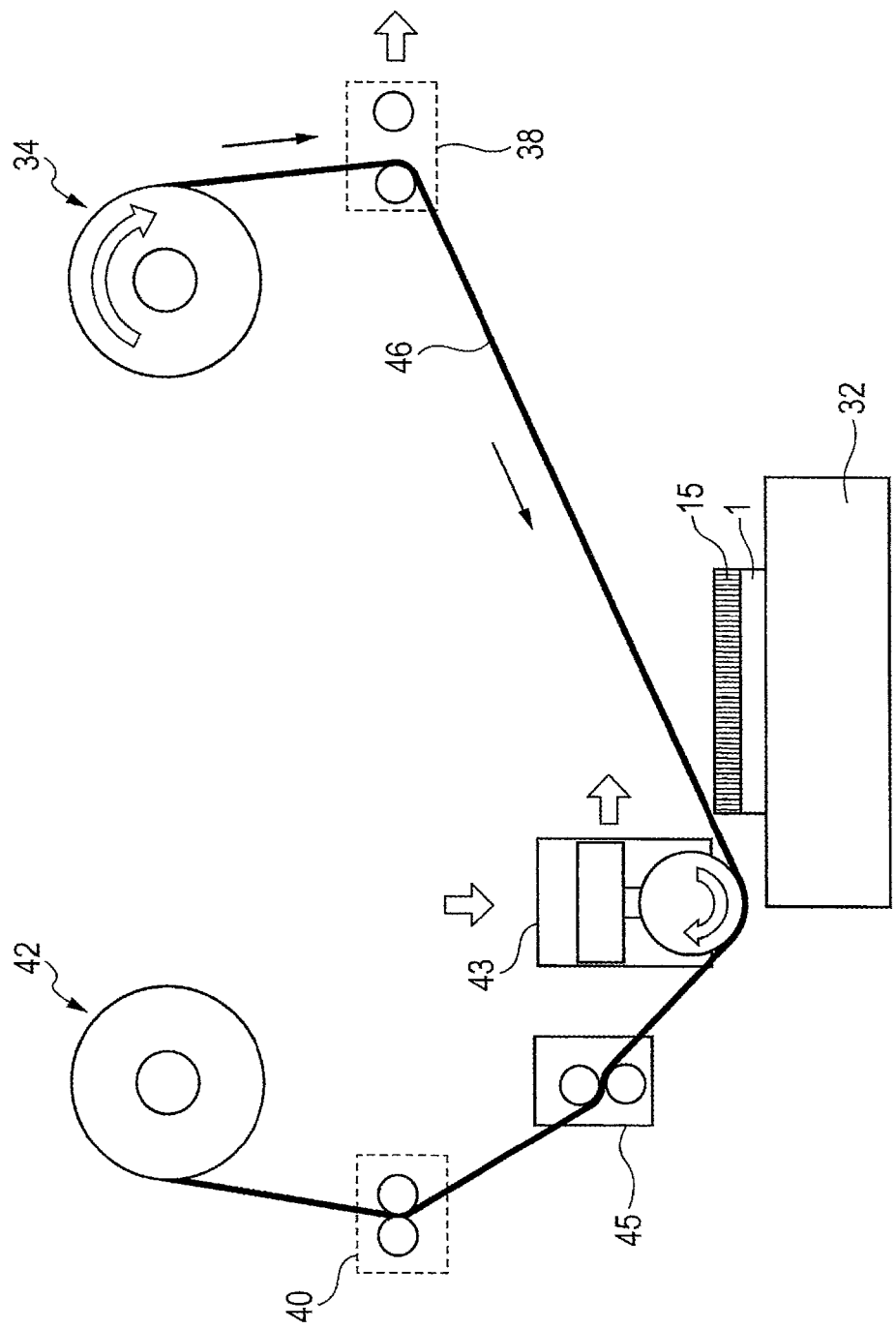
FIG. 16 is a schematic cross-sectional view of a BG tape peeling apparatus in one sub-step (step in which attaching of a peeling pressure-sensitive adhesive tape is started) of the step of peeling a surface protective tape for back grinding in the manufacturing method of a semiconductor device according to the one embodiment of the invention.
Figure 17:
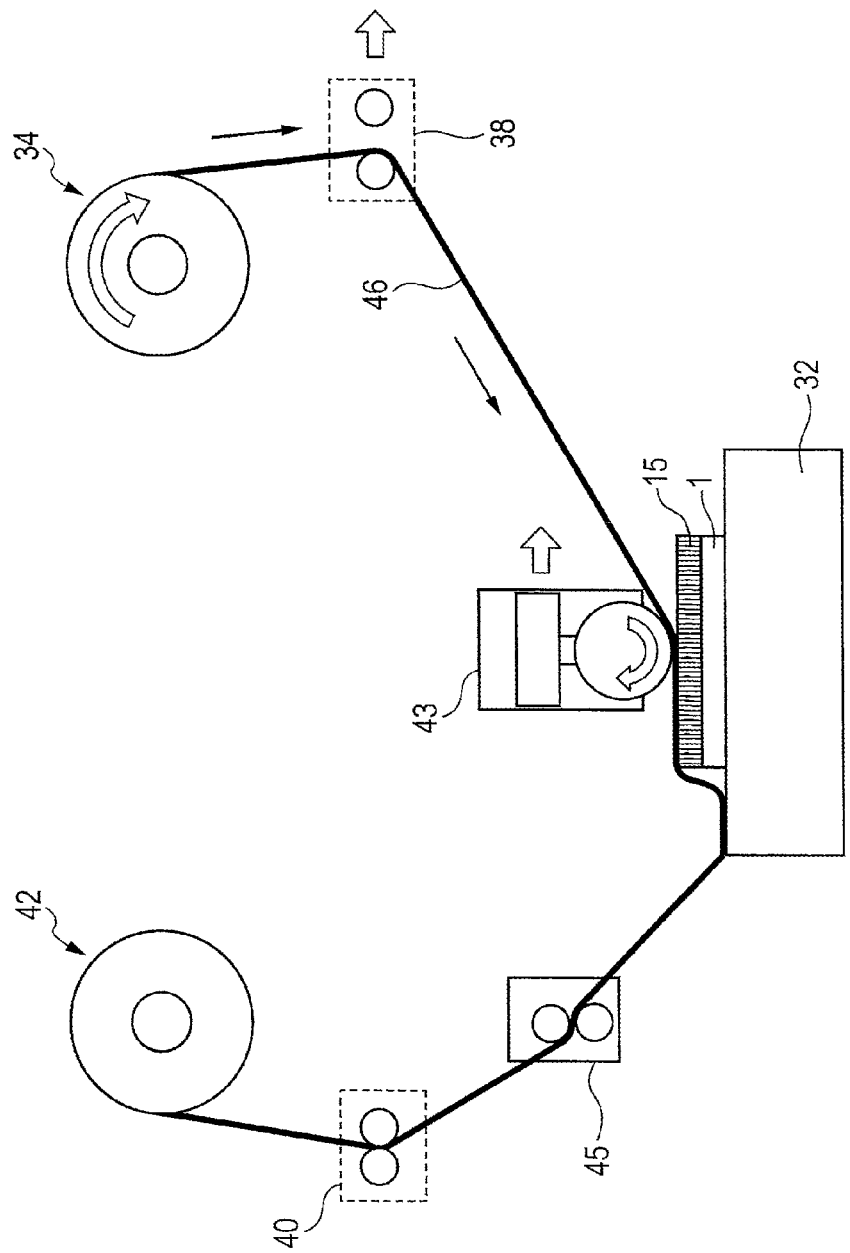
FIG. 17 is a schematic cross-sectional view of a BG tape peeling apparatus in one sub-step (step in which attaching of a peeling pressure-sensitive adhesive tape advances) of the step of peeling a surface protective tape for back grinding in the manufacturing method of a semiconductor device according to the one embodiment of the invention.
Figure 18:
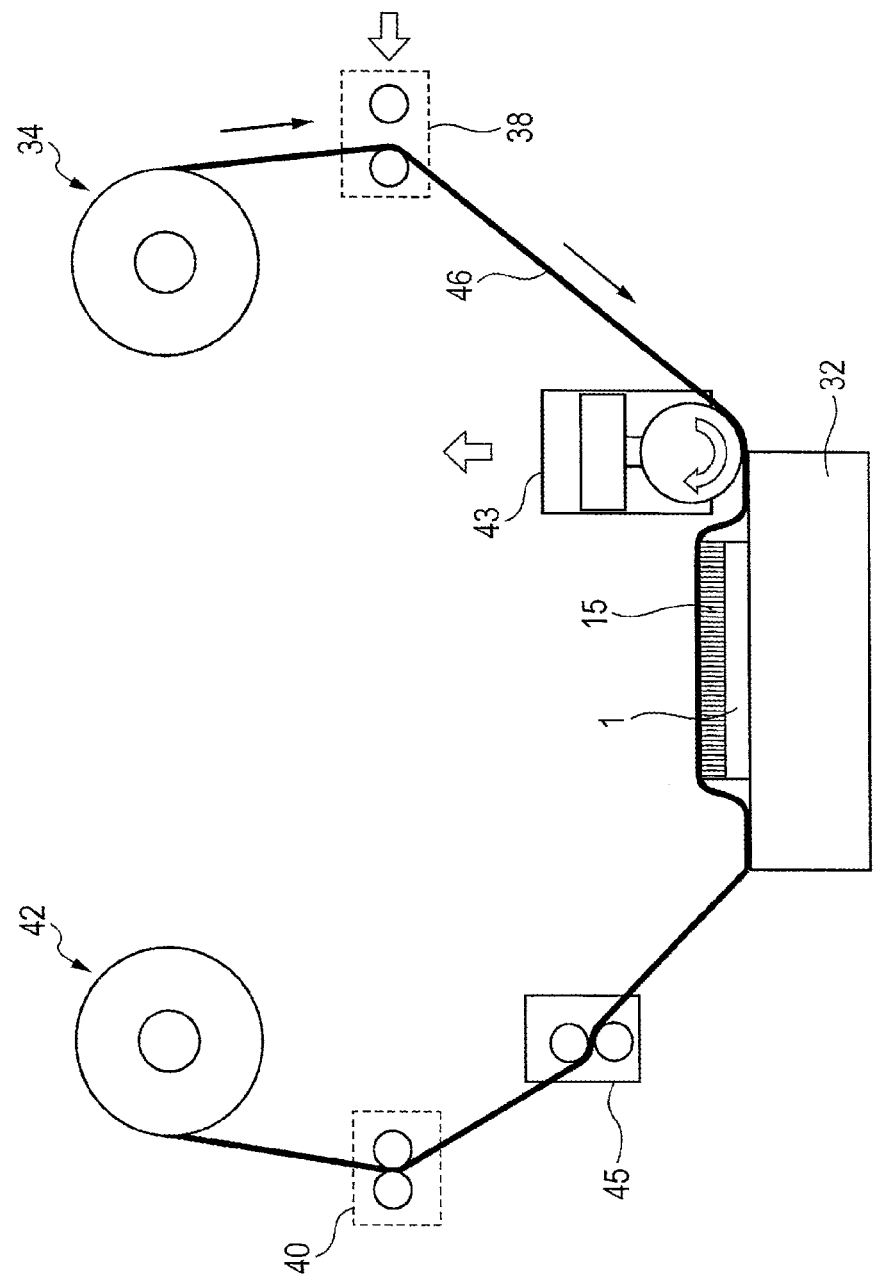
FIG. 18 is a schematic cross-sectional view of a BG tape peeling apparatus in one sub-step (step in which attaching of a peeling pressure-sensitive adhesive tape is completed) of the step of peeling a surface protective tape for back grinding in the manufacturing method of a semiconductor device according to the one embodiment of the invention.
Figure 19:
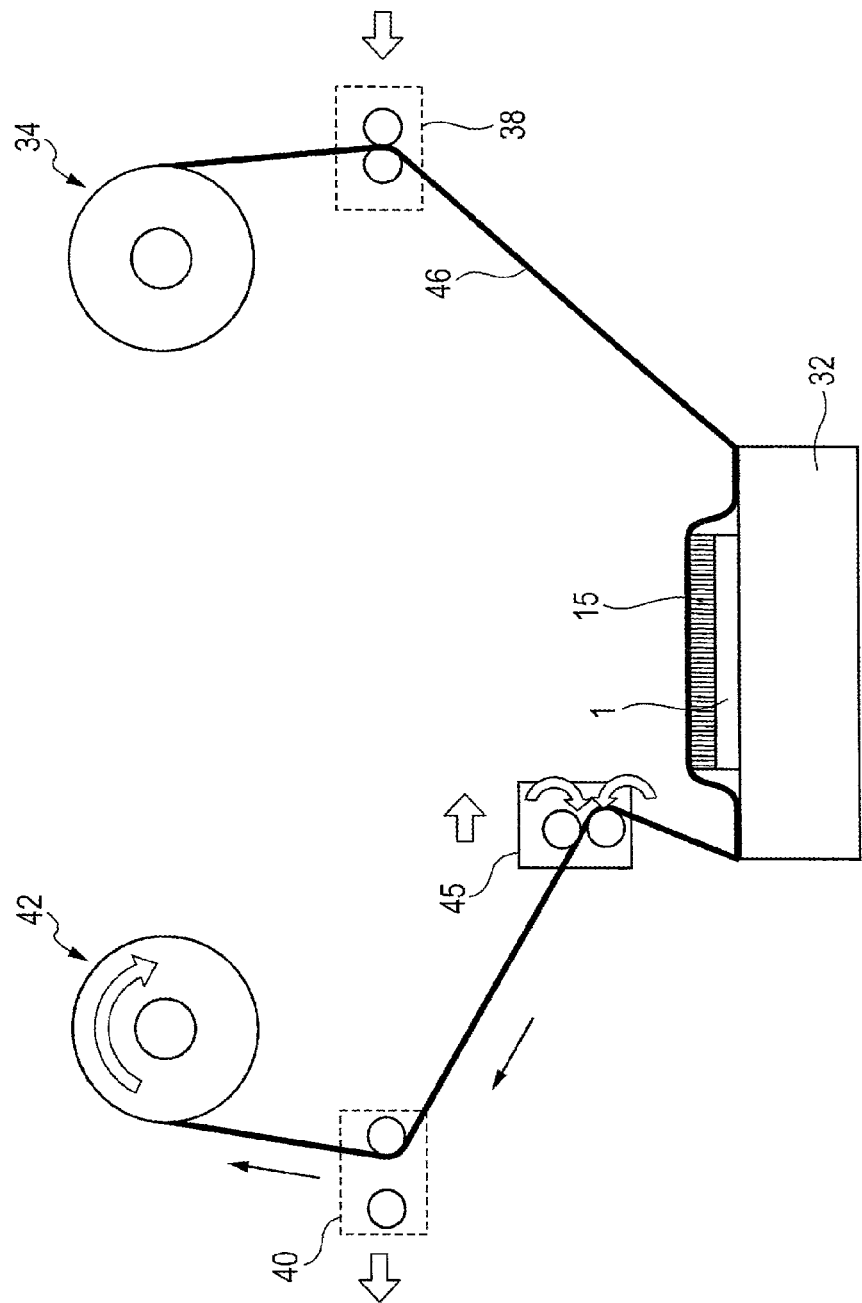
FIG. 19 is a schematic cross-sectional view of a BG tape peeling apparatus in one sub-step (step in which peeling of the BG tape is started) of the step of peeling a surface protective tape for back grinding in the manufacturing method of a semiconductor device according to the one embodiment of the invention.
Figure 20:
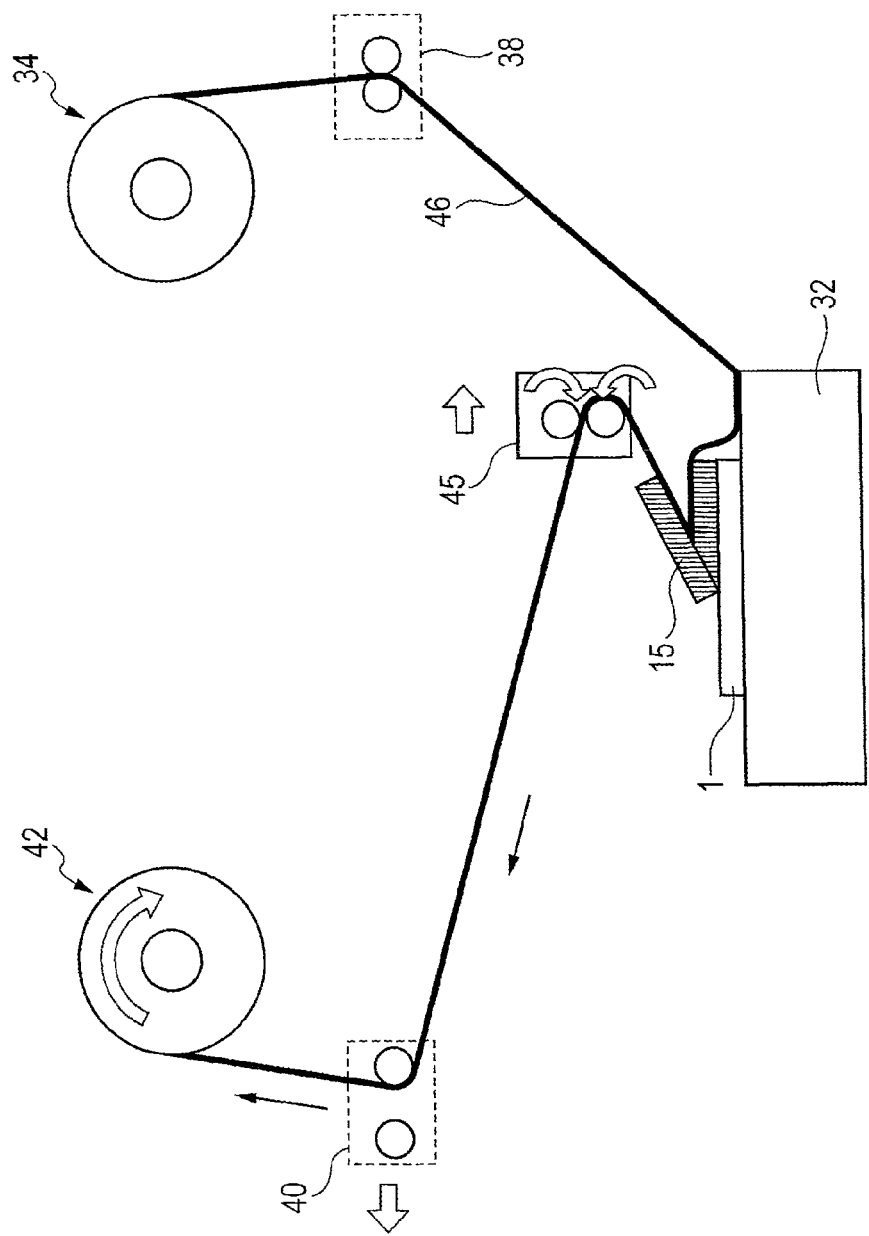
FIG. 20 is a schematic cross-sectional view of a BG tape peeling apparatus in one sub-step (step in which peeling of the BG tape advances) of the step of peeling a surface protective tape for back grinding in the manufacturing method of a semiconductor device according to the one embodiment of the invention.
Figure 23:
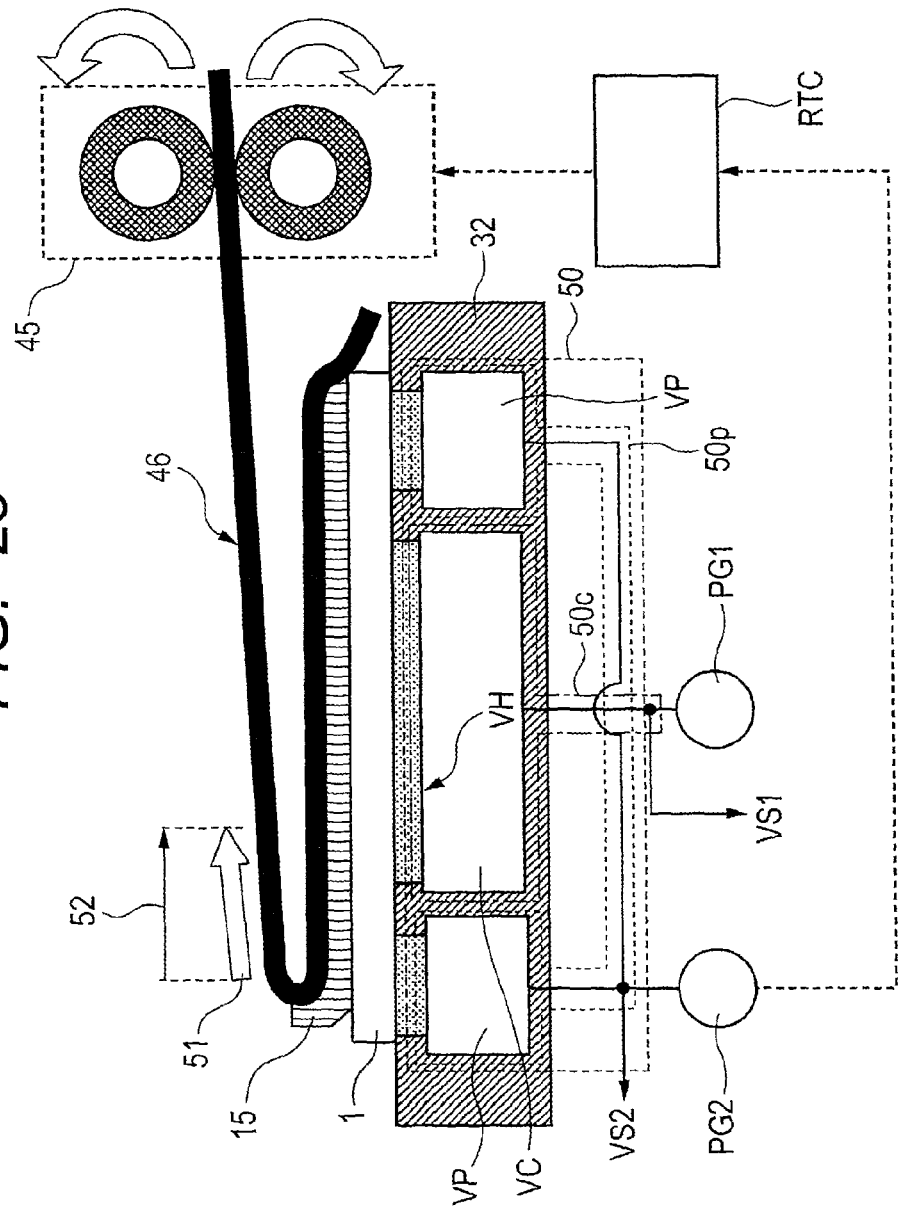
FIG. 23 is a schematic cross-sectional view, at the periphery of the wafer, showing the state of the wafer, each tape, and adsorption stage immediately after peeling is started.
Figure 24:
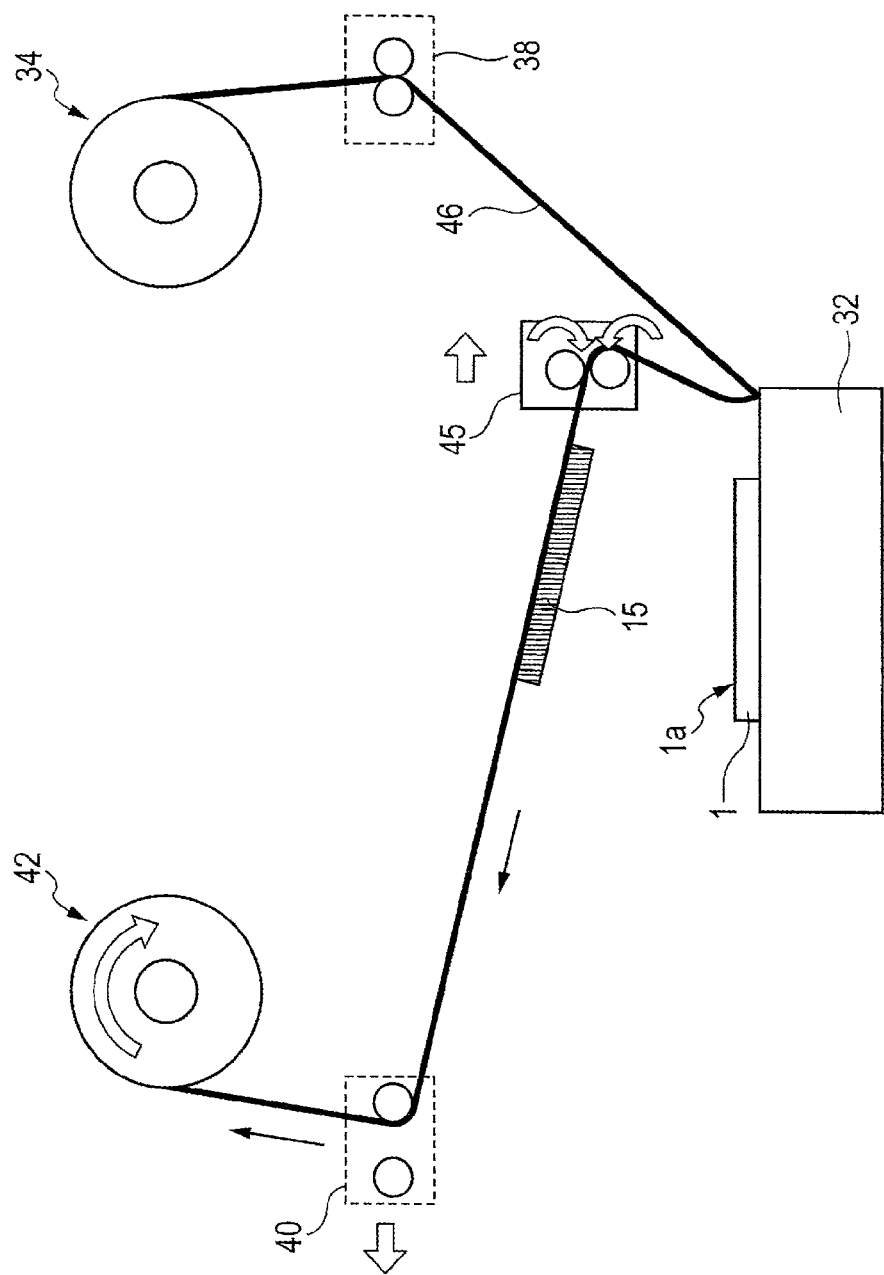
FIG. 24 is a schematic cross-sectional view of a BG tape peeling apparatus in one sub-step (step in which peeling of the BG tape is completed) of the step of peeling a surface protective tape for back grinding in the manufacturing method of a semiconductor device according to the one embodiment of the invention.
Figure 26:
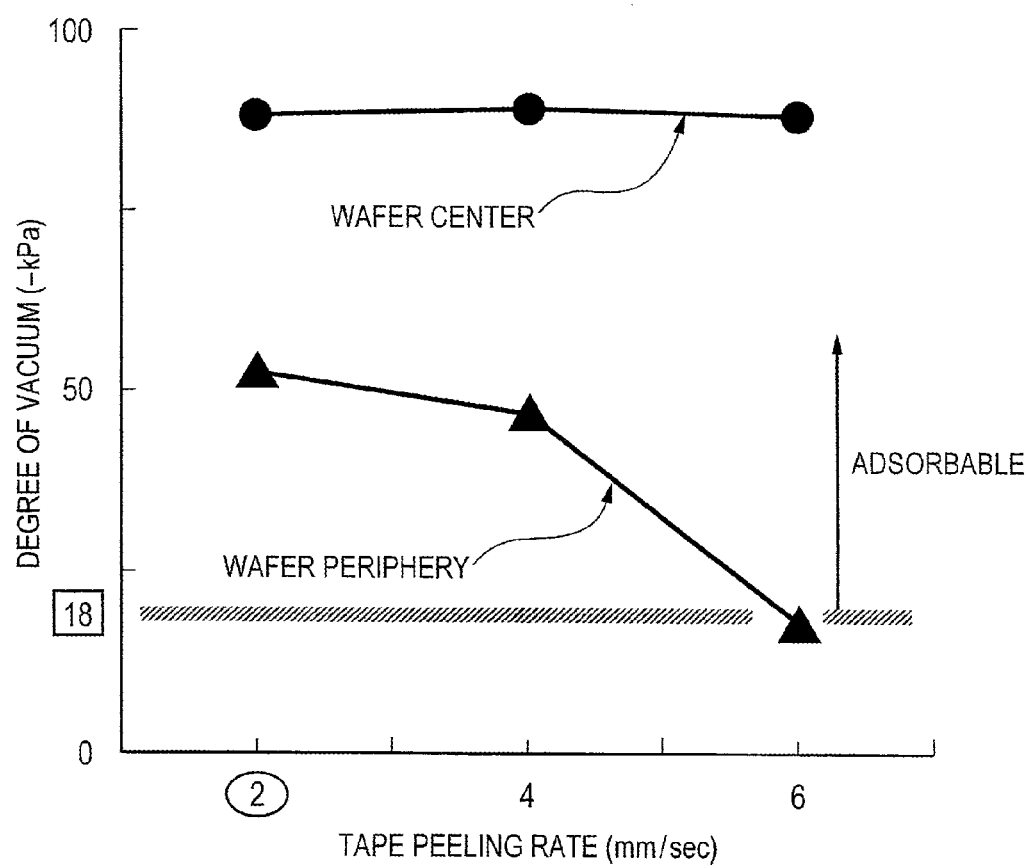
FIG. 26 is a data plot diagram showing the relationship between the tape peeling rate and the degree of vacuum of each vacuum system in the BG tape peeling step.

FIG. 16 is a schematic cross-sectional view of a BG tape peeling apparatus in one sub-step (step in which attaching of a peeling pressure-sensitive adhesive tape is started) of the step of peeling a back-grinding surface protective tape in the manufacturing method of a semiconductor device according to the one embodiment of the invention. FIG. 17 is a schematic cross-sectional view of a BG tape peeling apparatus in one sub-step (step in which attaching of a peeling pressure-sensitive adhesive tape advances) of the step of peeling a back-grinding surface protective tape in the manufacturing method of a semiconductor device according to the one embodiment of the invention. FIG. 18 is a schematic cross-sectional view of a BG tape peeling apparatus in one sub-step (step in which attaching of a peeling pressure-sensitive adhesive tape is completed) of the step of peeling a back-grinding surface protective tape in the manufacturing method of a semiconductor device according to the one embodiment of the invention. FIG. 19 is a schematic cross-sectional view of a BG tape peeling apparatus in one sub-step (step in which peeling of the BG tape is started) of the step of peeling a back-grinding surface protective tape in the manufacturing method of a semiconductor device according to the one embodiment of the invention. FIG. 20 is a schematic cross-sectional view of a BG tape peeling apparatus in one sub-step (step in which peeling of the BG tape advances) of the step of peeling a back-grinding surface protective tape in the manufacturing method of a semiconductor device according to the one embodiment of the invention. FIG. 21 is an enlarged perspective view (example of a narrow-width peeling tape) at the periphery of the wafer shown in FIG. 20. FIG. 22 is an enlarged false top view (modification example using a broad-width peeling tape) at the periphery of the wafer shown in FIG. 20. FIG. 23 is a schematic cross-sectional view, at the periphery of the wafer, showing the state of the wafer, each tape, and adsorption stage immediately after peeling is started. FIG. 24 is a schematic cross-sectional view of a BG tape peeling apparatus in one sub-step (step in which peeling of the BG tape is completed) of the step of peeling a back-grinding surface protective tape in the manufacturing method of a semiconductor device according to the one embodiment of the invention. FIG. 26 is a data plot diagram showing the relationship between the tape peeling rate and the degree of vacuum of each vacuum system in the BG tape peeling step. Based on these diagrams, the back-grinding surface protective tape peeling step and the like in the manufacturing method of a semiconductor device according to the one embodiment of the invention will next be described.

After completion of the backside metal electrode formation step 106 in FIG. 2, the wafer 1 is subjected to a BG tape peeling step 107. FIG. 16 shows a schematic cross-section of a BG tape peeling apparatus immediately before attaching of the peeling pressure-sensitive adhesive tape 46 is started. As shown in FIG. 16, the wafer 1 is vacuum-adsorbed to and retained on a wafer adsorption stage 32 of the BG tape peeling apparatus with the side of the BG tape 15 up. A peeling pressure-sensitive adhesive tape 46 (strong adhesive tape) is supplied from a tape feed unit 34 and supplied onto the BG tape 15 on the wafer 1 by means of a peeling pinch roller 45. The peeling pressure-sensitive adhesive tape 46 is then taken up by a tape take-up unit 42 via the peeling pinch roller 45 and a tape discharge pinch roller 40, and the like.

In the step in which attaching of a peeling pressure-sensitive adhesive tape is started, an attaching roller 43 approaches the wafer 1 while pushing down the peeling pressure-sensitive adhesive tape 46 and it descends to a position lower than the BG tape 15 on the wafer 1.

As shown in FIG. 17, in the step in which attaching of a peeling pressure-sensitive adhesive tape advances, the attaching roller 43 travels while pushing down the upper surface of the BG tape 15 on the wafer 1 from the upper surface of the wafer adsorption stage 32 outside of one end portion of the wafer 1 and moving up and down along the unevenness toward the outside of the other end portion of the wafer 1. By this motion, as shown in FIG. 18, attaching of the peeling pressure-sensitive adhesive tape is completed. In the procedures from FIG. 16 to FIG. 18, an intermediate portion (an intermediate portion between the tape feed unit 34 and the tape take-up unit 42) of the peeling pressure-sensitive adhesive tape is attached to the external surface of the surface protective tape from the peripheral vicinity of the surface protective tape to the internal region thereof.

Next, as shown in FIG. 19, in the step in which peeling of the BG tape is started, the tape discharge tape chuck 40 opens and the peeling pressure-sensitive adhesive tape 46 is taken up into the tape take-up unit 42 and at the same time, the peeling pinch roller 45 starts moving in a direction crossing the wafer 1.

Then, as illustrated in FIG. 20, in the step in which peeling of the BG tape advances, peeling of the BG tape 15 has made appreciable progress and the peeling pinch roller 45 has already passed over the wafer 1. Until complete peeling, however, the pinch roller continues running in the direction distant from the wafer 1. FIG. 24 shows the state of the step in which peeling of the BG tape is completed.

The peeling pressure-sensitive adhesive tape 46 usable here may have a diameter smaller than that of the wafer 1 as shown in FIG. 21 (narrow-width peeling tape system). As shown in FIG. 22, on the other hand, the peeling pressure-sensitive adhesive tape 46 may have a diameter equal to or greater than (broad-width peeling tape system) that of the wafer 1. The broad-width peeling tape system is advantageous because it permits smooth peeling. The narrow-width peeling tape system is, on the other hand, advantageous because it facilitates control of the peeling tape process.

The state, between FIG. 19 and FIG. 20, during the initial peeling period at which the BG tape 15 starts peeling from the wafer 1 will next be described in detail. As shown in FIG. 23, the wafer adsorption stage 32 has therein a circular central suction chamber VC which is circular in a planar view and an annularly peripheral suction chamber VP which is placed outside the circular central suction chamber and is annular in a planar view and these chambers are provided with a number of vacuum suction holes. The circular central suction chamber VC is coupled to a vacuum suction hole VH corresponding thereto, a vacuum gauge PG1, and a vacuum source VS1 and they configure an internal suction system 50c. The annularly peripheral suction chamber VP is coupled to a vacuum suction hole VH corresponding thereto, a vacuum gauge PG2, and a vacuum source VS2 and they configure a peripheral suction system 50p. This means that the vacuum suction system 50 has the internal suction system 50c and the peripheral suction system 50p. The internal suction system 50c performs vacuum suction of the internal region of the wafer 1 and the peripheral suction system 50p performs vacuum suction of the periphery of the wafer 1.

In at least the initial stage of peeling operation, the BG tape 15 is separated from the first main surface 1a of the wafer 1 by applying a tension 51 containing a component force 52, which is directed to the internal region from a portion of the BG tape 15 attached to the peripheral vicinity, to an outwardly extended portion of the peeling tape 46 on the side of the peripheral vicinity of the wafer, viewed from the intermediate portion (a portion attached to the wafer 1) of the BG tape 15.

Such a system is employed because of the following reason. The wafer 1 from which the BG tape 15 is separated is already very thin so that a strong tension is applied to the peeling pressure-sensitive adhesive tape 46. If this tension propagates to the BG tape 15, the end portion of the wafer 1 lying therebelow is lifted up easily and as a result, there is a fear of a space easily appearing between the upper surface of the wafer adsorption stage 32 and the lower surface of the wafer 1. The space between the upper surface of the wafer adsorption stage 32 and the lower surface of the wafer 1 leads to a leak of the vacuum suction system, which easily causes deterioration in the entire suction power when the vacuum suction system is a single one.

In the above-mentioned example, the vacuum suction system is divided into two systems (plural systems may also be employed) so that even generation of a leak in the end portion, that is, in the peripheral suction system 50p has hardly any influence on the internal suction system 50c. This leak therefore does not interfere with the peeling operation conducted subsequently. In addition, it is possible to prevent undesirable peeing of the wafer 1 from the upper surface of the wafer adsorption stage 32 by monitoring the degree of vacuum of the peripheral suction system 50p by means of the vacuum gauge PG2 and, when a leak is detected, reducing the torque of the peeling pinch roller 45 by using a peeling pinch roller torque control system RTC and thereby reducing the tape peeling rate.

FIG. 26 shows such advantages. Described specifically, in the above-mentioned configuration (two systems) of the vacuum suction system, the internal suction system 50c always shows high suction capacity (high degree of vacuum) and the peripheral suction system 50p shows smaller suction capacity but shows an adsorbable lower limit (−18 kPa) at a tape peeling rate smaller than 6 mm/sec. This reveals that the tape peeling rate may be controlled to keep a peeing rate smaller than 6 mm/sec by controlling the torque of the peeling pinch roller 45 by using the peeling pinch roller torque control system RTC. The leak problem almost disappears when the tape peeling rate is kept at, for example, smaller than 2 mm/sec, but it slows the peeling rate extremely.

Next, as shown in FIG. 24, after completion of the peeling of the BG tape 15, subsequent treatments of the wafer 1 are started. As shown in FIG. 2, a wafer probe test step 108 using a prober is conducted. In this case, in the circularly and peripheral thick wafer system, this test is conducted readily by directly applying a probe to both the surface 1a and the back surface 1b of the wafer 1. It is effective in the characteristic test between emitter and collector. In the flat wafer system, on the other hand, it is possible to make a similar test by directly applying a probe to the surface 1a of the wafer 1 while adsorbing the back surface 1b of the wafer 1 to a conductive vacuum chuck.

Next, as shown in FIG. 2, the back surface 1b of the wafer 1 is attached to a dicing tape (dicing tape attaching step 109). Then, dicing is conducted by means of a rotary blade to separate the wafer 1 into individual chips 2 (dicing step 110). This dicing tape 110 may also be conducted by laser dicing as well as dicing by means of a rotary blade. They may also be used in combination. Then, an assembly step 111 (if necessary, wire bonding step, die bonding step, sealing step, and the like) of each chip 2 is conducted.

6. Summary

The invention made by the present inventors has been described based on some embodiments. It is needless to say that the invention is not limited to them, but can be changed without departing from the scope of the invention.

For example, in the above-mentioned embodiments, a power IGBT was described specifically as one example of power semiconductors. It is needless to say that the invention is not limited to it but can also be applied to a power MOSFET or the like.

Moreover, in the above-mentioned embodiments, a trench gate type IGBT was described specifically as one example of the power IGBT. It is needless to say that the invention can be applied not only to it but also to a planar type IGBT or another insulating gate type power transistor.

In the above-mentioned embodiments, mainly an N channel device was described specifically. It is needless to say that the invention can be applied not only to it but also to a P channel device without a substantial change.

In the above-mentioned embodiments, mainly a simple device was described specifically. It is needless to say that the invention can be applied not only to it but also to a composite semiconductor chip (semiconductor device) which has incorporated therein an insulating gate type power transistor without a substantial change.

Moreover, in the above-mentioned embodiments, mainly a silicon device was described specifically. It is needless to say that the invention can be applied not only to it but can also be applied, without a substantial change, to a device using a substrate material belonging to another group such as SiC-based material or GaN-based material.

What is claimed is:

1. A method of manufacturing a semiconductor device, comprising the steps of:
    (a) forming a semiconductor element over a first main surface of a semiconductor wafer;
    (b) after the step (a), attaching a surface protective tape onto a substantially entire surface of the first main surface of the semiconductor wafer;
    (c) performing back grinding of a second main surface of the semiconductor wafer while having the surface protective tape on the substantially entire surface of the first main surface of the semiconductor wafer;
    (d) after the step (c), attaching an intermediate portion of a peeling pressure-sensitive adhesive tape to an external surface of the surface protective tape from a peripheral vicinity of the surface protective tape to an internal region thereof; and
    (e) after the step (d), applying a tension containing a component force, which is directed from a portion of the surface protective tape attached to the peripheral vicinity to the internal region, to an externally extended portion of the peeling pressure-sensitive adhesive tape on the side of the peripheral vicinity in relation to the intermediate portion while having the second main surface of the semiconductor wafer adsorbed onto a vacuum adsorption stage, and thereby separating the surface protective tape from the first main surface of the semiconductor wafer,
    wherein the vacuum adsorption stage has two vacuum suction systems, that is, a peripheral suction system for the peripheral vicinity and an internal suction system for the internal region.

2. The method of manufacturing a semiconductor device according to claim 1, wherein the peripheral suction system performs vacuum adsorption of the peripheral part of the wafer, while the internal suction system performs vacuum adsorption of the internal region of the wafer.

3. The method of manufacturing a semiconductor device according to claim 2,
wherein application of a tension in the step (e) is performed by means of a pinch roller and the torque of the pinch roller is controlled based on monitoring results of the degree of vacuum of the peripheral suction system so as not to substantially cause a leak in the peripheral suction system.

4. The method of manufacturing a semiconductor device according to claim 3,
wherein upon completion of the step (c), the wafer has, on a substantially entire surface thereof, a substantially uniform thickness.

5. The method of manufacturing a semiconductor device according to claim 3,
wherein upon completion of the step (c), the wafer is relatively thick at the peripherally annular end portion thereof and the wafer is relatively thin and has a substantially uniform thickness on the substantially entire surface of the internal region thereof.

6. The method of manufacturing a semiconductor device according to claim 1, further comprising the steps of:
(f) after the step (e), making a probe test of the semiconductor wafer; and
(g) after the step (f), attaching a dicing tape onto a substantially entire surface of the second main surface of the semiconductor wafer.

7. The method of manufacturing a semiconductor device according to claim 6,
wherein the semiconductor device has a power active element.

8. The method of manufacturing a semiconductor device according to claim 6,
wherein the semiconductor device has an IGBT.

9. A method of manufacturing a semiconductor device, comprising the steps of:
(a) forming a semiconductor element over a first main surface of a semiconductor wafer;
(b) after the step (a), attaching a surface protective tape onto a substantially entire surface of the first main surface of the semiconductor wafer;
(c) performing back grinding of a second main surface of the semiconductor wafer while having the surface protective tape on the substantially entire surface of the first main surface of the semiconductor wafer;
(d) after the step (c), attaching, to a substantially entire surface of the external surface of the surface protective tape, an intermediate portion of a peeling pressure-sensitive adhesive tape having a width equal to or greater than the diameter of the wafer; and
(e) after the step (d), applying, to an externally extended portion of the peeling pressure-sensitive adhesive tape on the side of a peripheral vicinity of the surface protective tape in relation to the intermediate portion, a tension containing a component force, which is directed from a portion of the surface protective tape attached to the peripheral vicinity to the internal region of the surface protective tape, while having the second main surface of the semiconductor wafer adsorbed onto a vacuum adsorption stage, and thereby separating the surface protective tape from the first main surface of the semiconductor wafer.

10. The method of manufacturing a semiconductor device according to claim 9,
wherein upon completion of the step (c), the wafer has a substantially uniform thickness on the substantially entire surface.

11. The method of manufacturing a semiconductor device according to claim 9,
wherein upon completion of the step (c), the wafer is relatively thick at the peripherally annular end portion thereof and the wafer is relatively thin and has a substantially uniform thickness on the substantially entire surface of the internal region thereof.

12. The method of manufacturing a semiconductor device according to claim 9, further comprising the steps of:
(f) after the step (e), making a probe test of the semiconductor wafer; and
(g) after the step (f), attaching a dicing tape on the substantially entire surface of the second main surface of the semiconductor wafer.

13. The method of manufacturing a semiconductor device according to claim 12,
wherein the semiconductor device has a power active element.

14. The method of manufacturing a semiconductor device according to claim 12,
wherein the semiconductor device has an IGBT.

15. A method of manufacturing a semiconductor device, comprising the steps of:
(a) forming a semiconductor element over a first main surface of a semiconductor wafer;
(b) after the step (a), attaching a surface protective tape onto a substantially entire surface of the first main surface of the semiconductor wafer by pressing the surface protective tape with a roller while adding a tension thereto;
(c) carrying out back grinding of a second main surface of the semiconductor wafer while having the surface protective tape on the substantially entire surface of the first main surface of the semiconductor wafer;
(d) after the step (c), attaching an intermediate portion of a peeling pressure-sensitive adhesive tape to an external surface of the surface protective tape; and
(e) after the step (d), applying, to an externally extended portion of the peeling pressure-sensitive adhesive tape on the side of a peripheral vicinity of the surface protective tape in relation to the intermediate portion, a tension containing a component force, which is directed from a portion of the surface protective tape attached to the peripheral vicinity to the internal region of the pressure-sensitive adhesive tape, while having the second main surface of the semiconductor wafer adsorbed onto a vacuum adsorption stage, and thereby separating the surface protective tape from the first main surface of the semiconductor wafer,
wherein the step (b) is performed while controlling the tension so as to prevent the surface protective tape from getting wrinkled, depending on the position of the roller.

16. The method of manufacturing a semiconductor device according to claim 15,
wherein in the step (b), the pressure applied to the roller is controlled so that a pressure per unit length of the roller be substantially uniform.

17. The method of manufacturing a semiconductor device according to claim 16,
wherein upon completion of the step (c), the wafer has a substantially uniform thickness on the substantially entire surface.

18. The method of manufacturing a semiconductor device according to claim 16,
wherein upon completion of the step (c), the wafer is relatively thick at the peripherally annular end portion thereof and the wafer is relatively thin and has a substantially uniform thickness on the substantially entire surface of the internal region thereof.

* * * * *